United States Patent
Richter et al.

(10) Patent No.: US 11,003,090 B2
(45) Date of Patent: May 11, 2021

(54) LITHOGRAPHY APPARATUS COMPRISING A PLURALITY OF INDIVIDUALLY CONTROLLABLE WRITE HEADS

(71) Applicant: Carl Zeiss SMT GmbH, Oberkochen (DE)

(72) Inventors: Stefan Richter, Jena (DE); Enrico Geissler, Jena (DE); Dirk Doering, Erfurt-Hochheim (DE); Lakshmanan Senthil Kumar, Erfurt (DE); Guenter Rudolph, Jena (DE); Martin Voelcker, Koenigsbronn-Zang (DE); Markus Deguenther, Florstadt (DE)

(73) Assignee: Carl Zeiss SMT GmbH, Oberkochen (DE)

(*) Notice: Subject to any disclaimer, the term of this patent is extended or adjusted under 35 U.S.C. 154(b) by 0 days.

(21) Appl. No.: 16/778,359

(22) Filed: Jan. 31, 2020

(65) Prior Publication Data

US 2020/0166852 A1    May 28, 2020

Related U.S. Application Data

(60) Division of application No. 15/600,898, filed on May 22, 2017, now abandoned, which is a continuation of (Continued)

(30) Foreign Application Priority Data

Nov. 27, 2014  (DE) .................. 102014224314.9

(51) Int. Cl.
G03F 7/20     (2006.01)
(52) U.S. Cl.
CPC .............................. *G03F 7/70383* (2013.01)

(58) Field of Classification Search
CPC .... G03F 7/704; G03F 7/7085; G03F 7/70291; G03F 7/70383; G03F 7/70391; G02B 26/123
(Continued)

(56) References Cited

U.S. PATENT DOCUMENTS 4,523,803 A    6/1985 Arao
5,015,066 A    5/1991 Cressman
(Continued)

FOREIGN PATENT DOCUMENTS

CN     1467517 A      1/2004
JP     H08-272104 A   10/1996
(Continued)

OTHER PUBLICATIONS

Chinese Office Action, with translation thereof, for corresponding CN Appl No. 201580064789.X, dated Feb. 3, 2020.
(Continued)

*Primary Examiner* — Robert Tavlykaev
(74) *Attorney, Agent, or Firm* — Fish & Richardson P.C.

(57) ABSTRACT

The disclosure relates to a lithography apparatus for writing to substrate wafers. The apparatus includes: a light generating device including one or a plurality of light sources for generating light; a writing device; a light transferring device including a number of optical waveguides for transferring the light from the light generating device to a writing device, the writing device including a plurality of individually controllable write heads for projecting the light from the one or the plurality of light sources in different regions of a substrate wafer; a transport device for moving the substrate wafer relative to the writing device in a predefined transport direction; and a control device for controlling the writing process on the substrate wafer.

22 Claims, 19 Drawing Sheets

Related U.S. Application Data application No. PCT/EP2015/059143, filed on Apr. 28, 2015.

(58) Field of Classification Search
USPC .......... 385/32, 49, 50, 115, 116, 147; 355/1, 355/67, 71
See application file for complete search history.

(56) References Cited

U.S. PATENT DOCUMENTS

| | | | |
|---|---|---|---|
| 5,930,433 | A | 7/1999 | Willimanson |
| 6,529,265 | B1 | 3/2003 | Henningsen |
| 6,731,843 | B2 | 5/2004 | Murali |
| 6,768,505 | B2 * | 7/2004 | Zelenka ............... B41J 2/45 347/233 |
| 6,922,230 | B2 | 7/2005 | Govil et al. |
| 6,930,302 | B2 * | 8/2005 | Benedict ............. G02B 26/10 250/234 |
| 6,960,035 | B2 * | 11/2005 | Okazaki ............. G02B 6/4206 385/33 |
| 7,010,211 | B2 | 3/2006 | Cohen |
| 7,197,201 | B2 | 3/2007 | Nakaya et al. |
| 7,248,338 | B2 | 7/2007 | Fukuda |
| 7,542,642 | B2 | 6/2009 | Monma |
| 8,194,301 | B2 | 6/2012 | Zhao et al. |
| 8,430,512 | B2 | 4/2013 | Smits |
| 9,097,981 | B2 * | 8/2015 | Hirota ................ G03F 7/70083 |
| 10,336,055 | B2 * | 7/2019 | Das ..................... B29C 64/182 |
| 2002/0145719 | A1 | 10/2002 | Govil et al. |
| 2002/0180944 | A1 | 12/2002 | Fujii et al. |
| 2003/0010936 | A1 * | 1/2003 | Udagawa ............. B82Y 10/00 250/492.21 |
| 2004/0037487 | A1 | 2/2004 | Nakaya et al. |
| 2004/0240813 | A1 | 12/2004 | Koyagi |
| 2005/0020926 | A1 | 1/2005 | Wiklof |
| 2005/0213071 | A1 * | 9/2005 | Fukuda ................ G03B 21/13 355/69 |
| 2006/0134535 | A1 | 6/2006 | Porque |
| 2008/0226034 | A1 | 9/2008 | Weir |
| 2008/0316454 | A1 | 12/2008 | Opower |
| 2009/0059295 | A1 * | 3/2009 | Mushano ........... G03F 7/70508 358/1.16 |
| 2009/0080317 | A1 * | 3/2009 | Martinez .............. G11B 7/0065 369/103 |
| 2009/0296063 | A1 | 12/2009 | Opower |
| 2010/0265482 | A1 | 10/2010 | Schubert et al. |
| 2011/0228237 | A1 | 9/2011 | Mulder |
| 2011/0300490 | A1 * | 12/2011 | Rachet ............... G03F 7/70191 430/322 |
| 2013/0250264 | A1 | 9/2013 | Schubert |
| 2014/0050439 | A1 * | 2/2014 | Liu ........................ G02B 6/136 385/14 |
| 2015/0109604 | A1 | 4/2015 | Masuda |
| 2017/0255110 | A1 | 9/2017 | Ritcher et al. |

FOREIGN PATENT DOCUMENTS

| | | |
|---|---|---|
| JP | 2002-359184 A | 12/2002 |
| JP | 2004-062157 A | 2/2004 |
| JP | 2004-354659 A | 12/2004 |
| JP | 2006-085072 A | 3/2006 |
| JP | 2009-111430 A | 5/2009 |
| JP | 2010-512549 A | 4/2010 |
| JP | 2011-507292 A | 3/2011 |
| JP | 2011-207292 A | 10/2011 |

OTHER PUBLICATIONS

International Search Report and Written Opinion for corresponding Appl No. PCT/EP2015/059143, dated Oct. 21, 2015. (18 pages).
Taiwanese Office Action and Search Report, with translation thereof, for corresponding TW Appl. No. 104113490, dated Nov. 12, 2018.
Japanese Office Action, with translation thereof, for corresponding JP Appl No. 2017-528794, dated Apr. 8, 2019.
Japanese Office Action, with translation thereof, for corresponding JP Appl No. 2017-528794, dated Mar. 2, 2020.
Fifth Office Action issued in corresponding CN Application No. 201580064789.X dated Feb. 2, 2020, and English translation (19 pages).
Chinese Office Action, with translation thereof, for corresponding CN Appl. No. 201580064789.X, dated Feb. 1, 2021.
Japanese Final Rejection, with translation thereof, for corresponding JP Appl No. 2017-528794, dated Mar. 4, 2021 (14 pages).

* cited by examiner

LITHOGRAPHY APPARATUS COMPRISING A PLURALITY OF INDIVIDUALLY CONTROLLABLE WRITE HEADS

CROSS-REFERENCE TO RELATED APPLICATIONS

The present application is a divisional of, and claims benefit under 35 USC 120 to, U.S. application Ser. No. 15/600,898, filed May 22, 2017, which is a continuation of, and claims benefit under 35 USC 120 to, international application PCT/EP2015/059143, filed Apr. 28, 2015, which claims benefit under 35 USC 119 of German Application No. 10 2014 224 314.9, filed Nov. 27, 2014. The entire disclosure of U.S. application Ser. No. 15/600,898, international application PCT/EP2015/059143 and German Application No. 10 2014 224 314.9 are incorporated by reference herein.

FIELD

The disclosure relates to a lithography apparatus including a plurality of write heads for writing to substrates. Furthermore, the disclosure relates to a write head for such a lithography apparatus.

BACKGROUND

Photolithographic patterning methods are typically used for producing microstructures, in which methods the desired structure is transferred into a photosensitive layer arranged on a substrate and the substrate is patterned in a desired manner via the exposed photosensitive layer in subsequent chemical and physical processes. Either imaging or directly writing exposure systems are used for transferring the respective structures into the photosensitive layer. In the first case, a pattern produced in a mask beforehand is projected onto the substrate in a greatly reduced fashion via a complex projection system. By using suitable masks, with the aid of a projection system it is possible to transfer a relatively large number of structures to the substrate all at once, which becomes apparent in a high throughput, in particular. On account of the high precision during the imaging of structures in the micrometres and nanometres range, projection exposure systems are constructed in a very complex fashion and are therefore also very cost-intensive both in terms of procurement and in operation. By contrast, directly writing lithography exposure systems, in which the desired structures are written directly into the photosensitive layer on the substrate wafer via a laser, manage with a significantly less complex construction. However, the writing speed of such directly writing laser systems does not suffice to obtain a throughput comparable with the projection exposure systems.

SUMMARY

The disclosure seeks to provide a directly writing lithography exposure apparatus which firstly can be constructed expediently from standard components and at the same time enables a sufficiently high throughput.

In one general aspect, the disclosure provides a lithography apparatus for writing to substrate wafers. The apparatus includes a light generating device that includes one or a plurality of light sources for generating light. The apparatus also includes a writing device and a light transferring device. The light transferring device includes a number of optical waveguides for transferring the light from the light generating device to the writing device. The writing device includes a plurality of individually controllable write heads for projecting the light from the one or the plurality of light sources in different regions of a substrate wafer. The apparatus also includes a transport device for moving the substrate wafer relative to the writing device in a predefined transport direction. In addition, the apparatus includes a control device for controlling the writing process on the substrate wafer.

In another general aspect, the disclosure provides a write head for such a lithography apparatus. The write head includes a light input coupling device for coupling the light from a plurality of optical waveguides into the write head. The write head also includes an optical device for generating a light spot composed of the light beams from the individual optical waveguides on the substrate wafer. The write head further includes a scanning device for moving the light spot in a scanning manner on the substrate wafer in a scanning direction transversely with respect to the transport direction.

In a further general aspect, the disclosure provides a method for writing to a substrate wafer with the aid of such a lithography apparatus. The substrate wafer is moved in a transport direction. A plurality of light beams are projected onto the substrate wafer in order to generate on the substrate wafer a light spot formed from a plurality of individual light spots. The light spot is moved in an oscillating fashion transversely with respect to the transport direction in order to generate a sinusoidal movement trajectory of the light spot on the substrate wafer. The light intensity of at least one of the light beams is varied during a scanning period in a manner dependent on the current speed of the light spot on the substrate wafer.

The disclosure provides a lithography apparatus for writing to substrate wafers including a light generating device including one or a plurality of light sources for generating light, a light transferring device including a number of optical waveguides for transferring the light from the light generating device to a writing device, the writing device including a plurality of individually controllable write heads for projecting the light from the one or the plurality of light sources in different regions of a substrate wafer, a transport device for moving the substrate wafer relative to the writing device in a predefined transport direction, and a control device for controlling the writing process on the substrate wafer. By using a plurality of individually controllable write heads, it is possible to significantly increase the exposure time of the substrate wafer and, in association therewith, also the throughput of the lithography apparatus.

In one embodiment it is provided that the write heads in each case include a light input coupling device for coupling the light from a plurality of optical waveguides into the respective write head, an optical device for generating a light spot composed of the light beams from the individual optical waveguides on the substrate wafer, and a scanning device for moving the light spot in a scanning manner on the substrate wafer in a scanning direction transversely with respect to the transport direction. By integrating the components into a single housing, it is possible to produce particularly compact write heads. By using light beams from a plurality of optical waveguides, it is possible to generate a particularly light-intensive light spot on the substrate. The latter in turn enables particularly high scanning speeds, which becomes apparent in a higher throughput. Furthermore, by setting the light intensity of the individual light beams, it is possible to vary the profile of the light spot used for writing. Different distortions of the writing beam can thus be compensated for.

Furthermore, the resolution obtained during the writing process can thus also be varied.

In a further embodiment it is provided that the scanning device of at least one write head includes an oscillating scanning mirror, which generates a sinusoidal movement trajectory of the light spot on the substrate wafer moving in the transport direction. In this case, the control device is designed to vary the light intensity of at least one of the light beams forming the light spot on the substrate wafer in a manner dependent on the current speed of the light spot on the substrate wafer during a scanning period. By varying the light intensity, it is possible to compensate for a different exposure of the substrate strip to be written to in regions of the turning points of the sinusoidal movement trajectory and, consequently, to achieve a homogeneous exposure over the entire width of the strip-shaped region to be written to. In particular, the light intensity is reduced in a suitable manner in the regions of the turning points of the sinusoidal trajectory. This can be carried out jointly both for individual light beams and for all light beams. With the use of pulsed light beams, a reduction of the light intensity can also be achieved by adapting the duty ratio of switch-on and switch-off times. In this case, in the regions of the turning points, the switch-on times of the light beams or of the respective light sources are reduced and/or the corresponding switch-off times are lengthened.

In a further embodiment, the write heads are designed to scan in each case separate window-shaped regions of the substrate wafer, wherein the window-shaped regions of the individual write heads are arranged in a manner offset relative to one another in the transport direction in such a way that the strip-shaped regions of the substrate wafer which are exposed by the individual write heads on account of the transport movement of the substrate wafer relative to the writing device form a continuous area. By this means, even relatively large areas can be written to particularly rapidly and precisely.

A further embodiment provides for the write heads of the writing device to be arranged one behind another and/or alongside one another in the transport direction of the substrate wafer. The arrangement one behind another allows the use of write heads whose diameter turns out to be significantly wider in comparison with their scanning region. By arranging the scanning heads alongside one another, it is possible for a plurality of groups including in each case a number of scanning heads arranged one behind another to be combined to form larger writing units.

In a further embodiment it is provided that provision is made of a detection device including a plurality of measuring devices assigned in each case individually to the individual write heads and serving for monitoring the width and/or the orientation of the strip-shaped regions exposed via the individual write heads. In this case, each measuring device includes at least two photodiodes arranged one behind another in the scanning direction of the light beam in a scanning region of the respective write head. With the aid of said detection device, the strip-shaped regions exposed by the different write heads can be coordinated with one another, with the result that a seamless overall area results therefrom. In this case, the light beams can be measured particularly simply with the aid of the photodiodes arranged below the write head.

In an alternative embodiment it is provided that a measuring device assigned to a write head includes two reflective structures, which are arranged in each case on a substrate wafer in a manner distributed along a scanning direction transversely with respect to the transport direction and in a manner enabling capture by the light spot of the respective write head, and a light detector, which is arranged in the respective write head and detects the light reflected from the reflective structures. A simple and precise measurement of the light beams can be obtained with the aid of this measuring device, too.

In a further embodiment it is provided that the measuring device is designed to individually detect each light beam of the light spot composed of the light beams from the individual optical waveguides. The profile of the light spot writing on the substrate wafer can be monitored by this means. This in turn makes it possible to produce structures having a higher resolution in the x-direction.

In a further embodiment it is provided that each light source is in each case assigned to a single write head, wherein the respective light source is individually drivable. By this means, the light intensity of the light beams of the respective write head can be achieved particularly simply by modulation of the light source. A specific electro-optical modulation device can therefore be omitted.

In a further embodiment it is provided that a light source is assigned to a plurality of write heads, wherein each of said write heads is assigned an individual electro-optical modulator for modulating the light intensity of the light provided by the light source. This makes it possible to use individual high-power light sources.

In a further embodiment it is provided that each of the optical waveguides assigned to a write head is respectively assigned a separately drivable electro-optical modulator. The light intensity of the individual beams of the write head can thus be controlled individually. By this means, in turn, the profile of the light spot generated by the respective write head on the substrate surface can be varied particularly simply.

The disclosure furthermore provides a write head for a lithography apparatus, wherein the write head includes a light input coupling device for coupling the light from a plurality of optical waveguides into the write head, an optical device for generating a light spot composed of the light beams from the individual optical waveguides on the substrate wafer, and a scanning device for moving the light spot in a scanning manner on the substrate wafer in a scanning direction transversely with respect to the transport direction. Such a write head can be constructed particularly compactly. By virtue of its small size, it is possible for a multiplicity of such individually drivable write heads to be combined to form larger writing units. Furthermore, the integration of the respective components into the write head housing permits particularly rapid installation and demounting of the respective write head.

In a further embodiment it is provided that the light input coupling device includes a plurality of waveguide structures formed in a transparent substrate, said waveguide structures, on the input side, being arranged at least at a distance from one another that corresponds to the diameter of the individual optical waveguides and, on the output side, converging to form a spatially narrowly delimited waveguide bundle. With the aid of such waveguide structures, the light beams from the individual optical waveguides that are used for the composite light spot can be aligned very precisely with respect to one another.

In a further embodiment it is provided that the input coupling device includes an arrangement of a plurality of microlenses and a telescope optical unit disposed optically downstream of the microlenses, wherein each of the microlenses is designed to image in a magnified fashion the output of an optical waveguide assigned to the respective microlens. The telescope optical unit is furthermore designed to reduce the imaging generated in this case, such that the light spot composed of the light beams of the individual optical waveguides arises on the substrate wafer. A precise alignment of the light beams of the individual optical waveguides can be realized relatively simply with the aid of the microlenses, too.

In a further embodiment it is provided that the scanning device includes at least one scanning mirror which is movable about a scanning axis and which is designed to guide the light spot imaged on the substrate wafer in a periodic scanning movement over the substrate wafer, said periodic scanning movement being carried out transversely with respect to the transport direction of the substrate wafer. With the aid of such a scanning device, it is possible to expose a relatively wide strip-shaped region via the light spot of a write head.

In a further embodiment it is provided that the scanning device is furthermore designed to perform a periodic line compensation movement of the light spot on the substrate wafer. With the aid of the periodic line compensation movement, it is possible to realize rectangular movement trajectories of the light spot on the substrate wafer, which enables a particularly effective exposure of the substrate area. Overall, it is thus possible to increase the writing speed of the write head and thus also the throughput of the lithography apparatus.

Finally, in a further embodiment it is provided that the optical device includes a collimator disposed optically upstream of the scanning device and serving for generating parallel light beams and a telecentric imaging optical unit and/or f-theta lens disposed optically downstream of the scanning device and serving for focussing the parallel light beams on the substrate wafer. With the aid of these devices, it is possible to obtain a particularly high precision during the projection of the light spot on the substrate wafer.

The disclosure furthermore provides a method for writing to a substrate wafer with the aid of a lithography apparatus, wherein the substrate wafer is moved in a transport direction and wherein a plurality of light beams are projected onto the substrate wafer in order to generate on the substrate wafer a light spot formed from a plurality of individual light spots. The light spot is furthermore moved in an oscillating fashion transversely with respect to the transport direction in order to generate a sinusoidal movement trajectory of the light spot on the substrate wafer. In this case, the light intensity of at least one of the light beams is varied during a scanning period in a manner dependent on the current speed of the light spot on the substrate wafer. By varying the light intensity, it is possible to compensate for the different exposure of the substrate strip to be written to and, consequently, to achieve a homogeneous exposure over the entire width of the strip-shaped region to be written to. In particular, the light intensity is reduced in the regions of the turning points of the sinusoidal trajectory. This can be carried out jointly both for individual light beams and for all light beams. With the use of pulsed light beams, a reduction of the light intensity can also be achieved by adapting the duty ratio of switch-on and switch-off times. In this case, in the regions of the turning points, the switch-on times of the light beams or of the respective light sources are reduced and/or the corresponding switch-off times are lengthened.

The disclosure is described in greater detail below with reference to figures, in which:

FIG. 1 schematically shows a lithography apparatus according to the disclosure with a writing device including a plurality of write heads;

Figure 8:
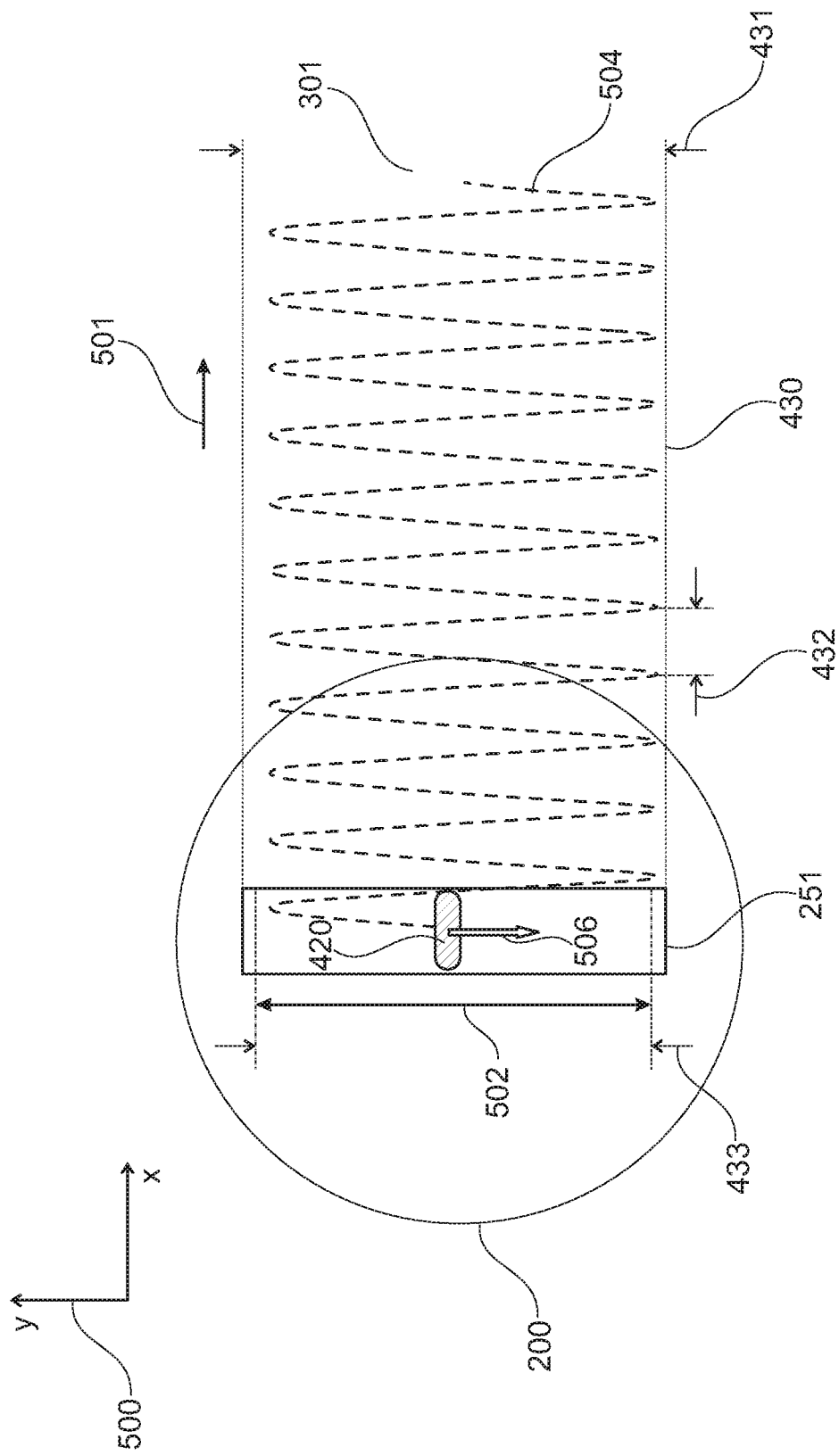
Figure 9:
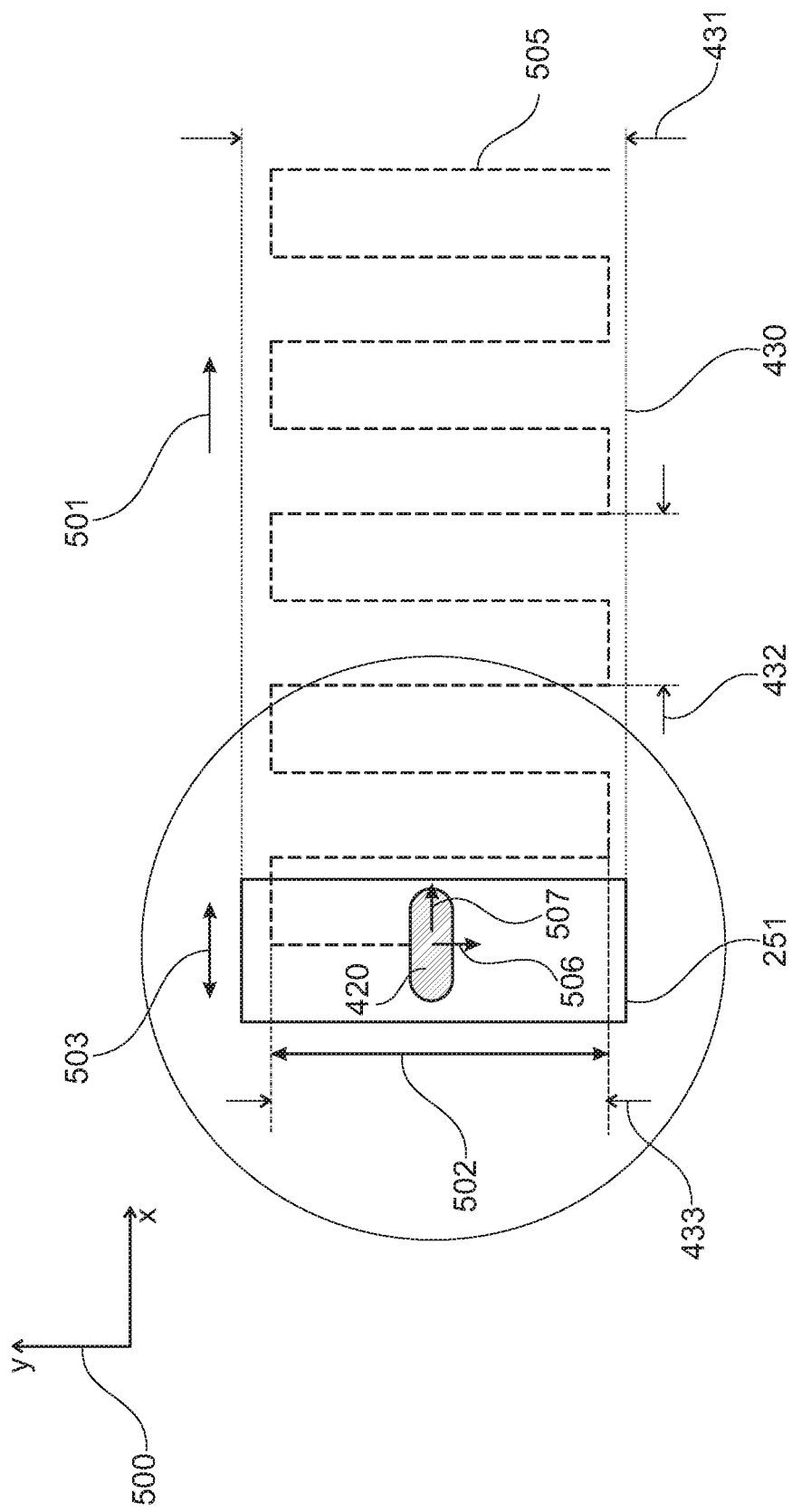
Figure 10:
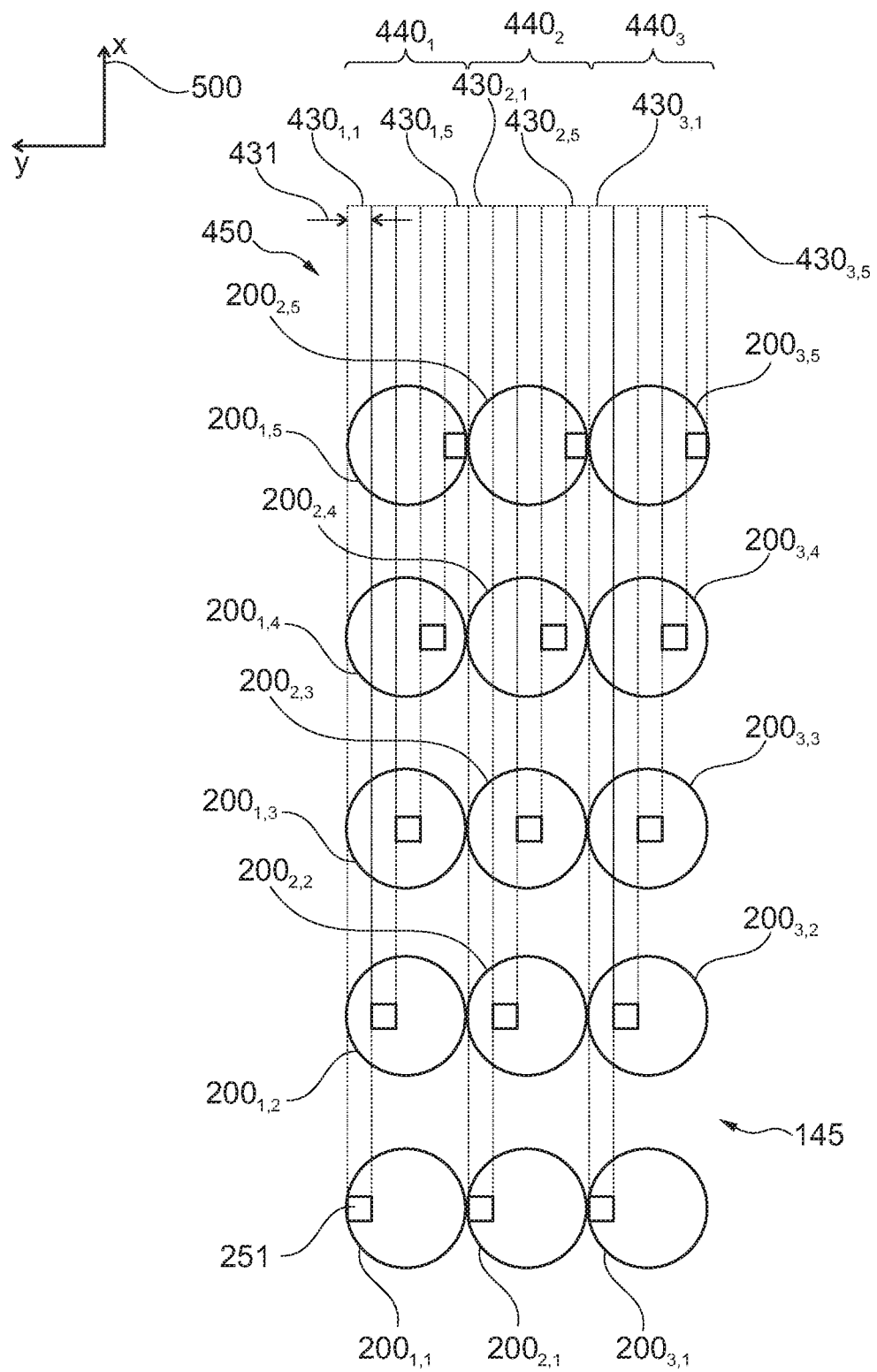
Figure 11:
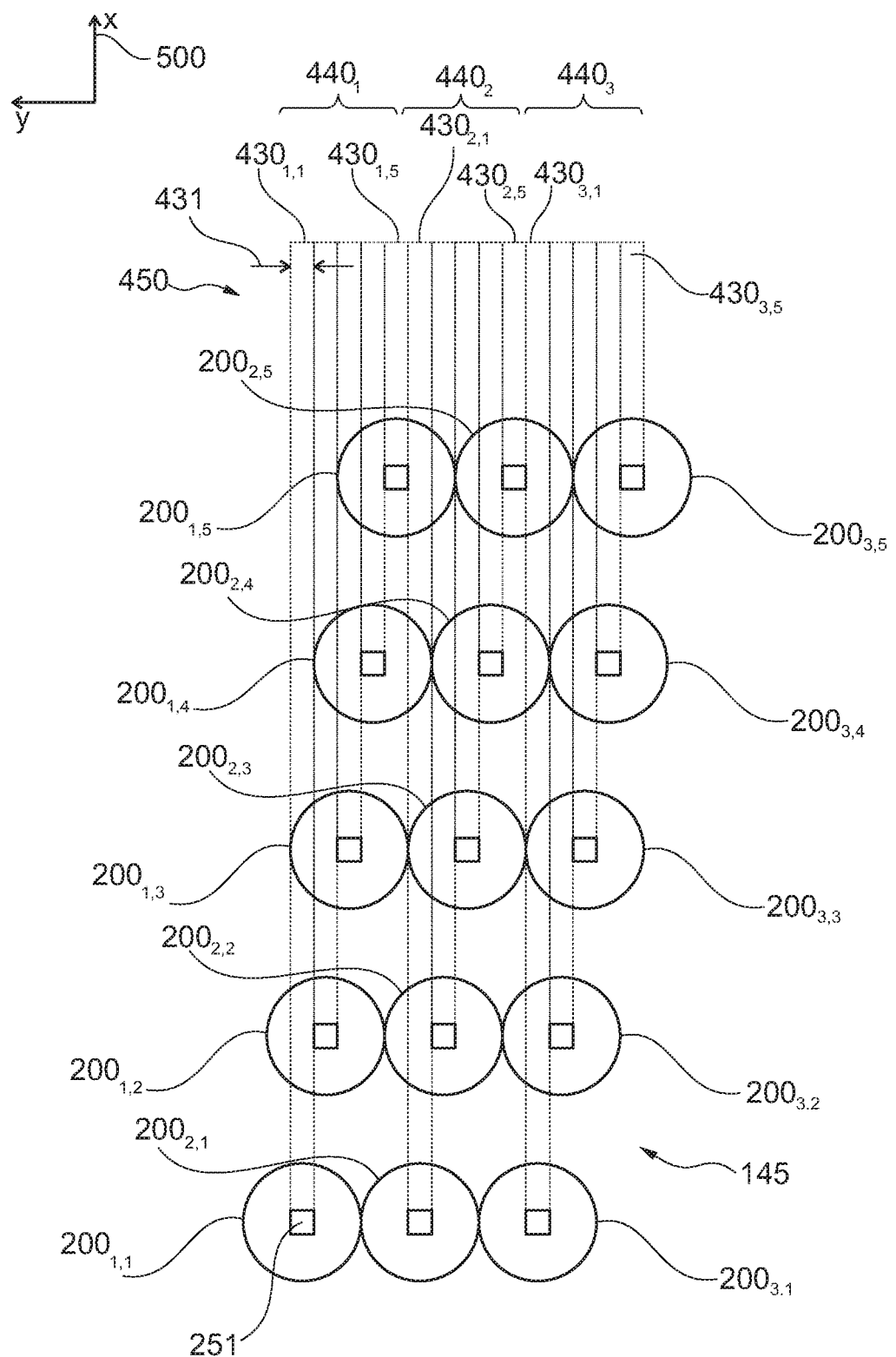
Figure 12:
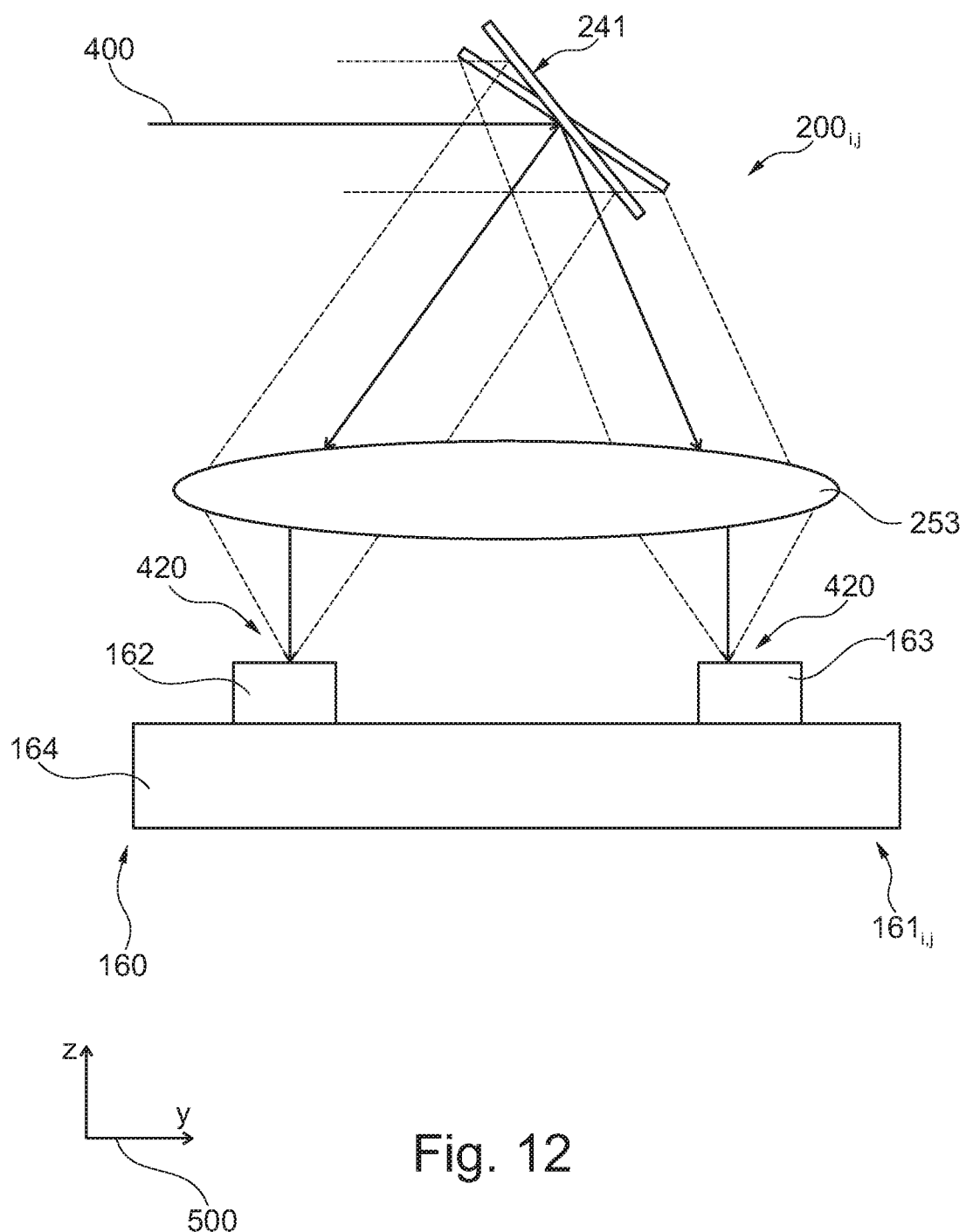
Figure 13:
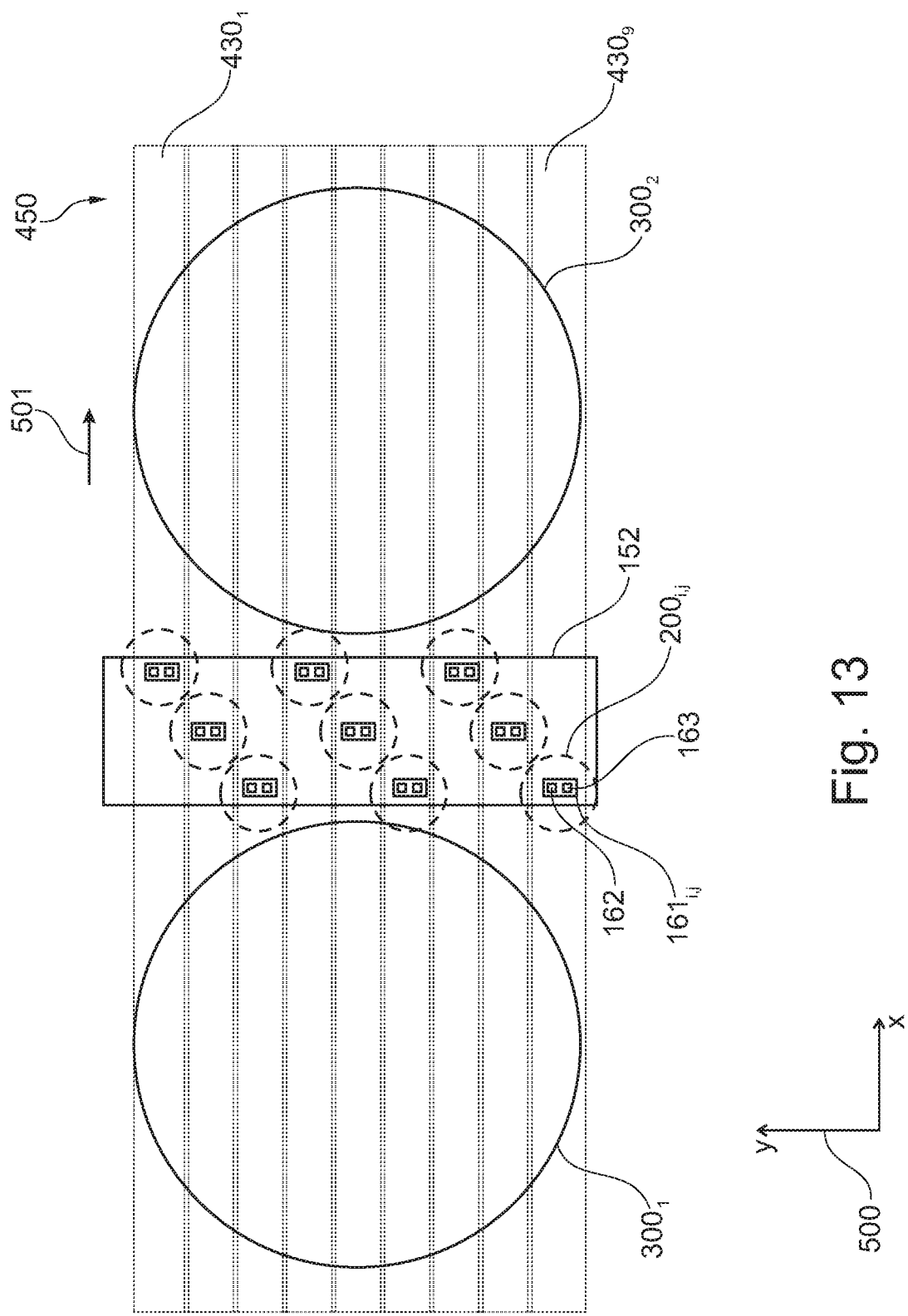
Figure 14:
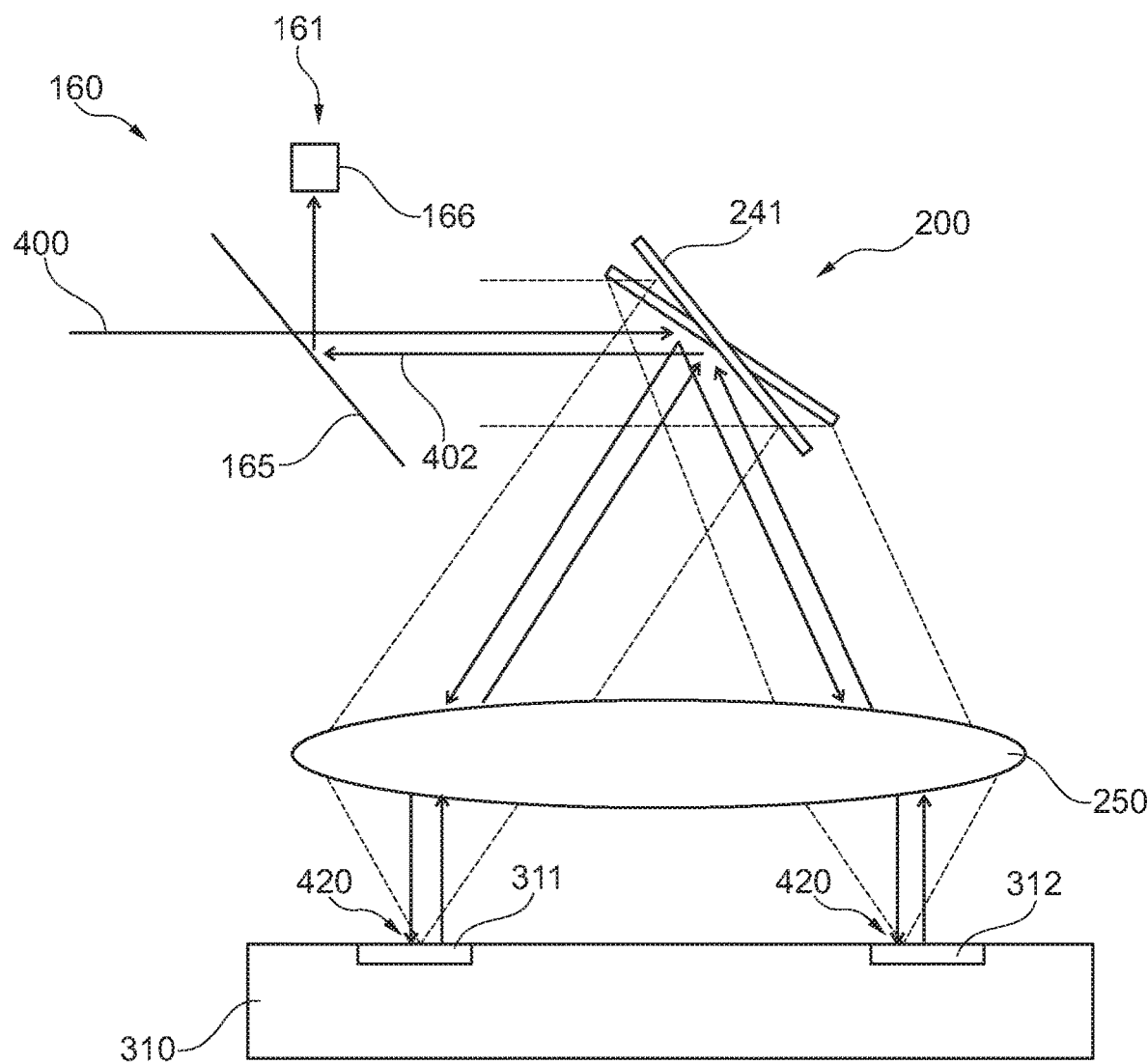
Figure 15:
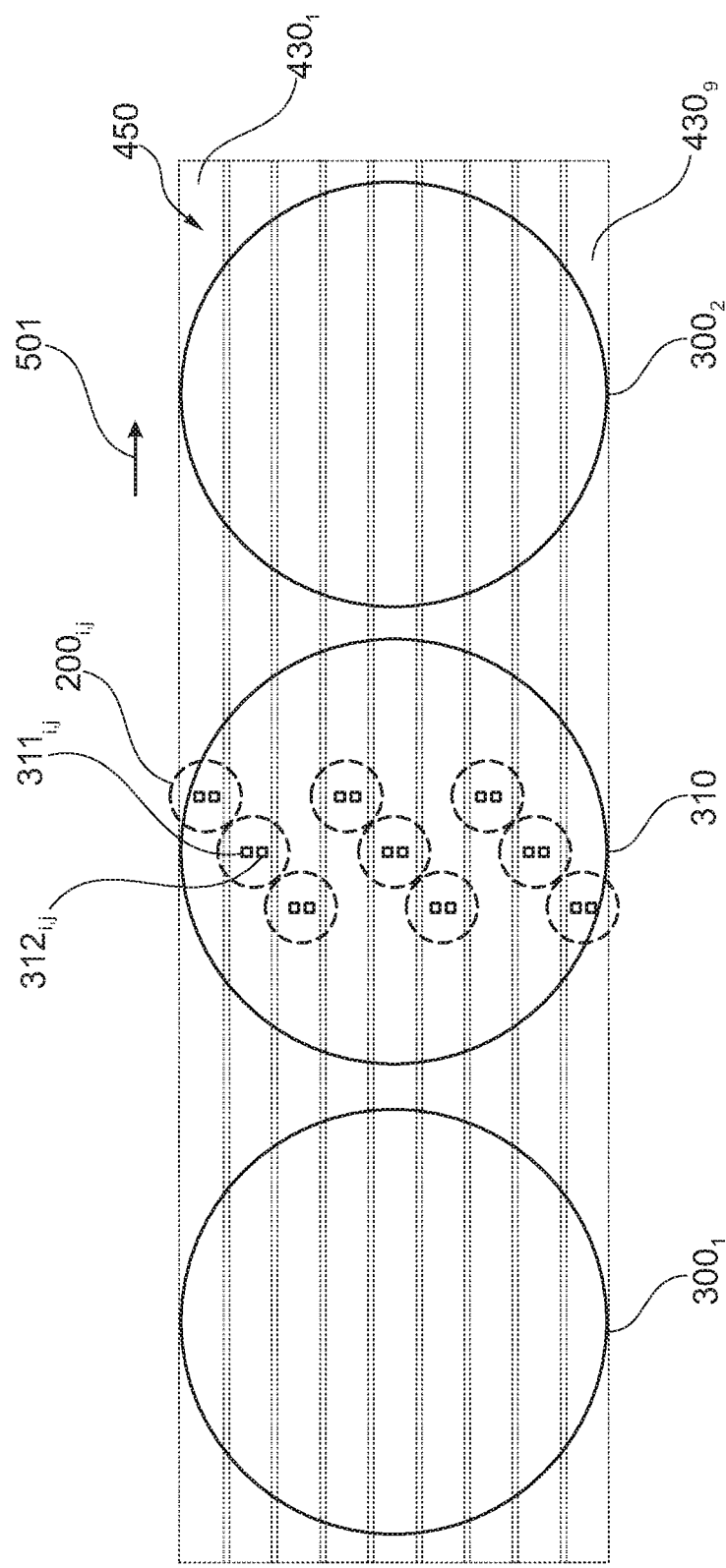
Figure 16:
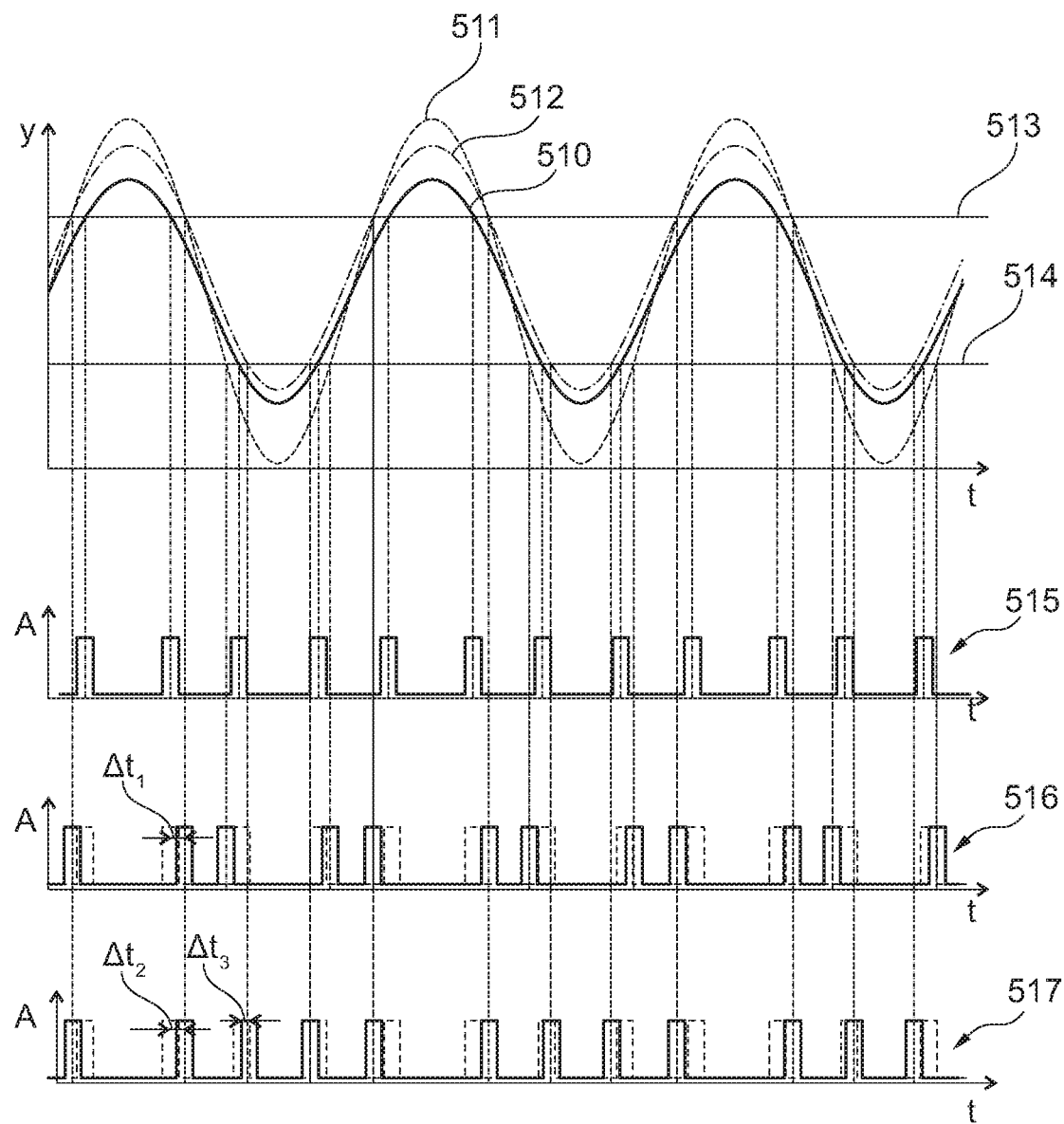
Figure 17:
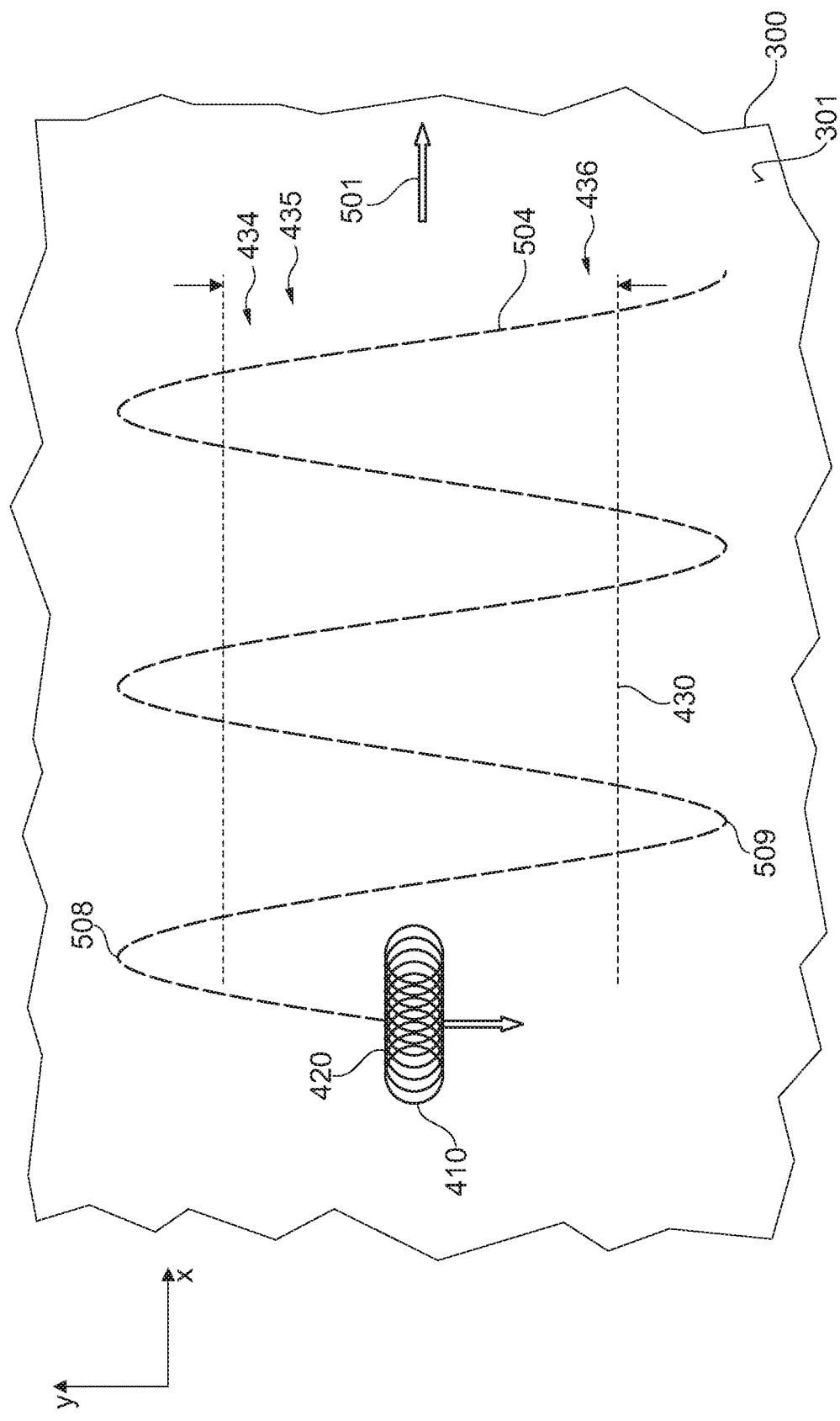
Figure 18:
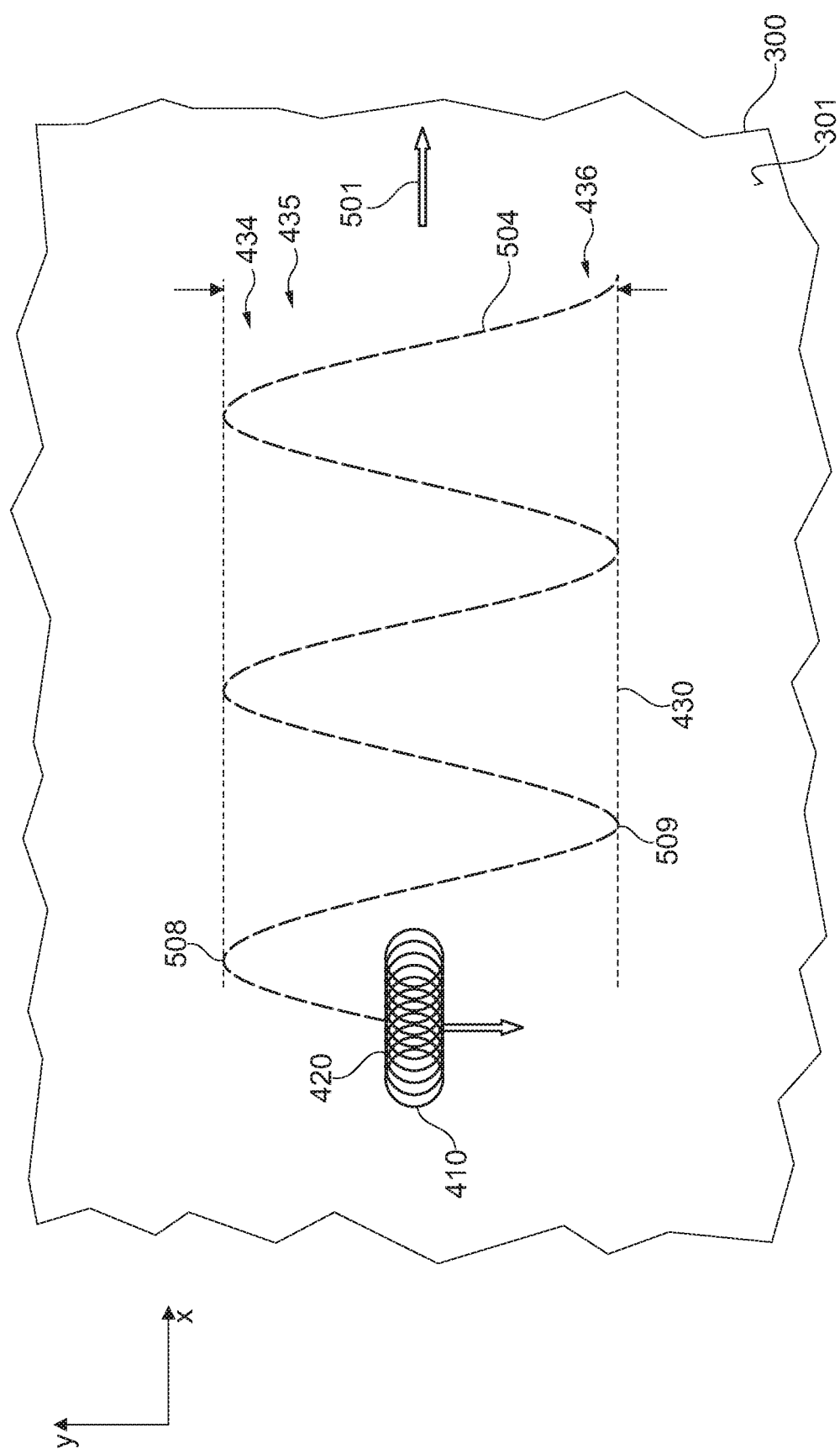
Figure 19:
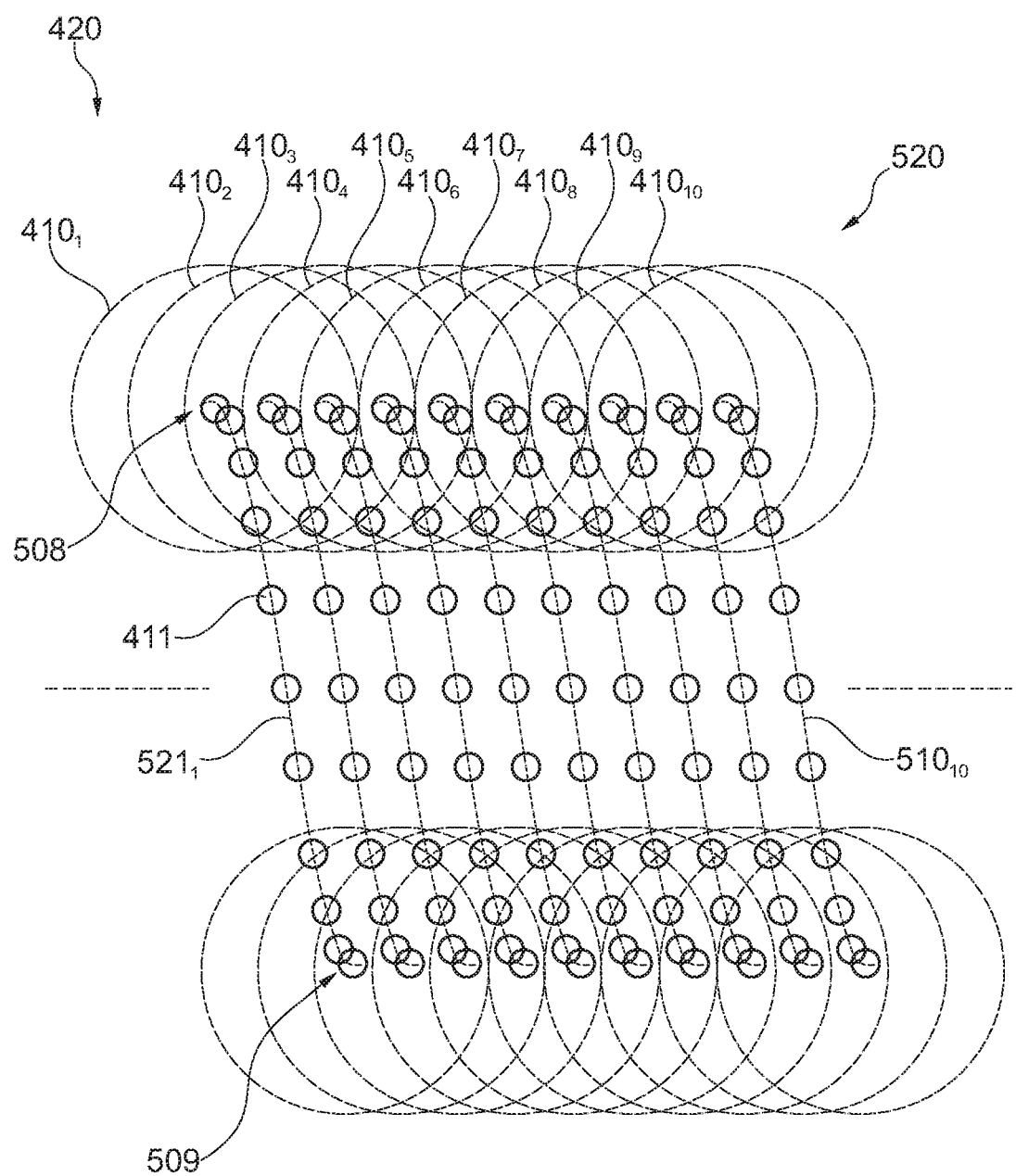
Figure 20:
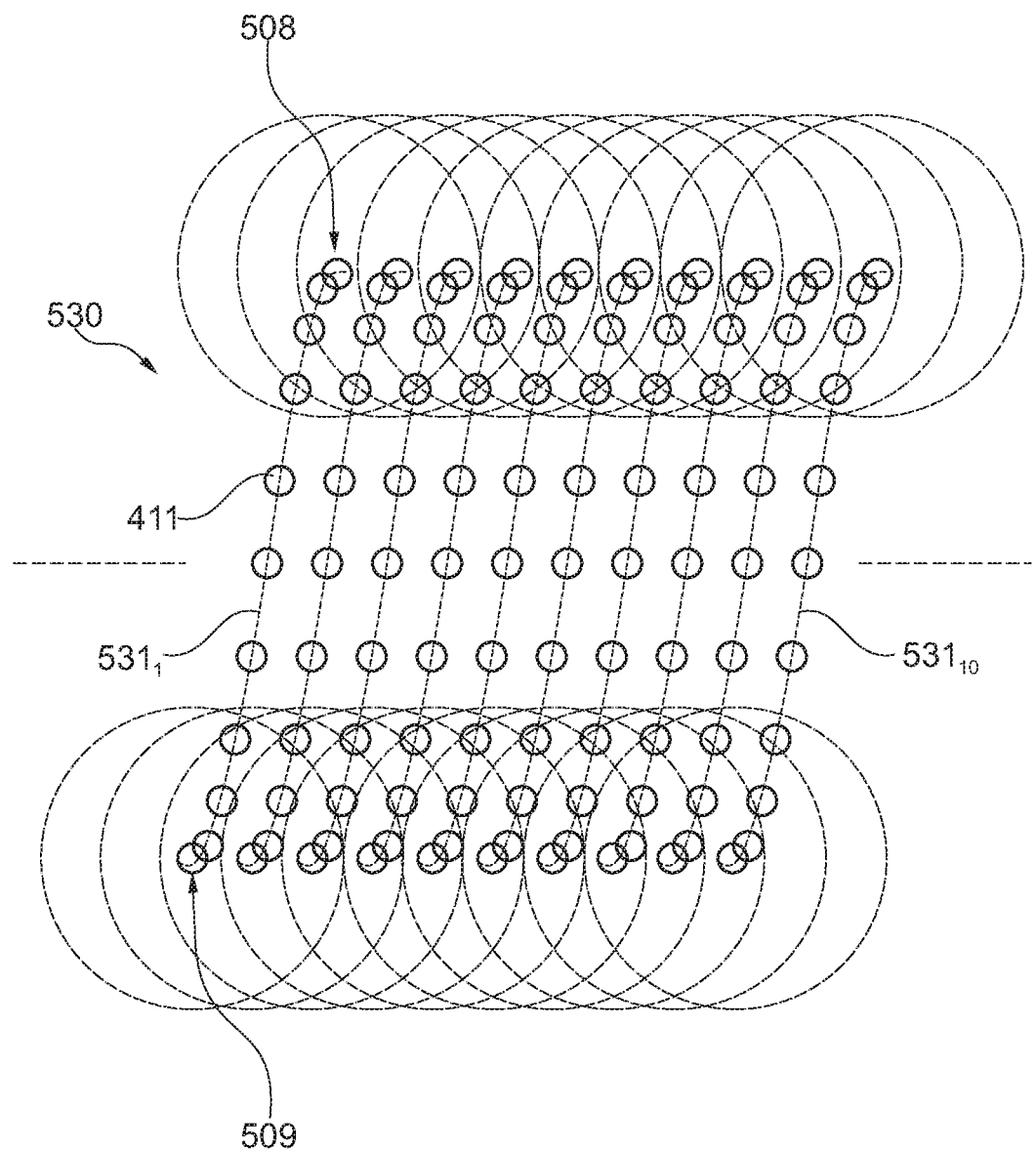

FIG. 8 schematically shows the exposure process of a substrate strip via an oscillating light spot;

FIG. 9 schematically shows an alternative form of scanning the substrate via a light spot guided in a rectangular trajectory over the substrate;

FIG. 10 schematically shows the scanning process of a continuous substrate area via a matrix-type arrangement of a plurality of write heads;

FIG. 11 schematically shows an alternative arrangement of the write heads for realizing a closed scanning area;

FIG. 12 schematically shows the construction of a detection device realized via photodiodes and serving for monitoring the writing beam of a write head of the lithography apparatus;

FIG. 13 schematically shows a plan view of a detection device from FIG. 12 arranged below the substrate wafers;

FIG. 14 shows the basic construction of an alternative detection device, which has a test substrate having reflective structures and serving for monitoring the writing process of a write head of the lithography apparatus;

FIG. 15 shows a plan view of a test substrate arranged between two regular substrate wafers;

FIG. 16 shows a diagram with temporal profiles of different variables for illustrating the manner of operation of the detection device;

FIG. 17 shows a scanning movement of the light spot with a relatively large amplitude and long dark phases;

FIG. 18 shows a scanning movement of the light spot with a relatively small scanning amplitude and for avoiding dark phases;

FIG. 19 shows a first partial exposure pattern during the falling edges of the scanning movement; and FIG. 20 shows a second partial exposure pattern during the rising edges of the scanning movement.

Figure 1:
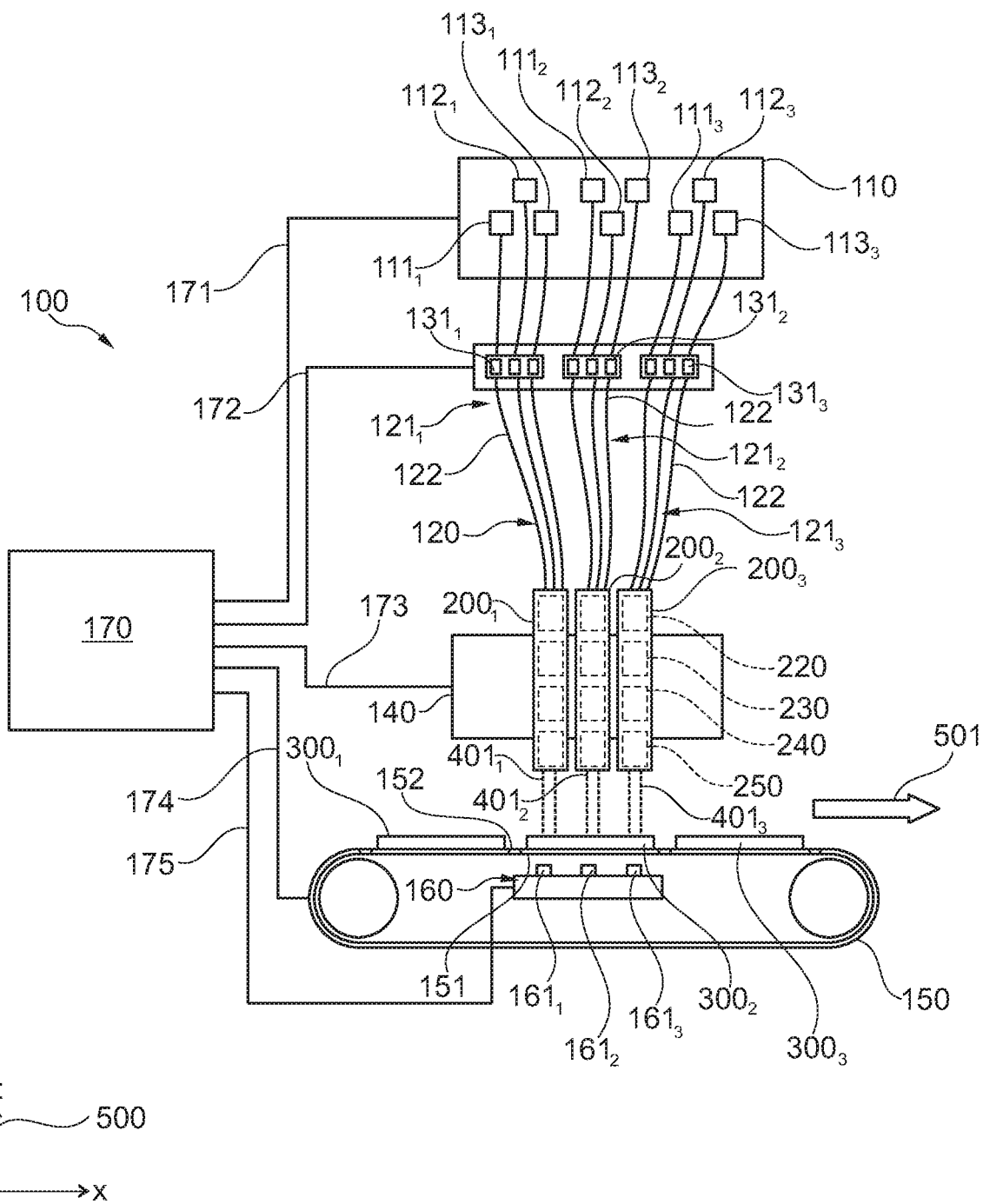

In order to realize a novel lithography apparatus, the intention is to use a preferably fixed compact write device including a plurality of individually drivable scanning write heads. In this case, the write heads are arranged above the substrate in such a way that a seamless exposure or inscription of the entire substrate surface is carried out via a transport movement of the substrate below the writing device. FIG. 1 schematically shows the basic construction of the lithography apparatus 100 according to the disclosure. In this case, such a lithography apparatus 100 includes a light generating device 110 for generating light having a desired wavelength and coherence, a light transferring device 120 for transferring the light from the light generating device 110 to the writing device 140, the writing device 140 including a plurality of individually operating write heads $200_1$, $200_2$, $200_3$ for writing to a substrate wafer $300_2$ (wafer) via a plurality of light beams $401_1$, $401_2$, $401_3$, a transport device 150 arranged below the writing device 140 and serving for precisely moving a substrate wafer $300_2$ during the writing process below the writing device 140, and a control device 170 for coordinating the operation of the individual components during the writing process. For the purpose of monitoring and calibration of the writing device 140, the lithography apparatus 100 can furthermore include a specific detection device 160.

The writing device 140 forms a central part of the lithography apparatus 100 according to the disclosure, said writing device substantially consisting of a specific arrangement of a plurality of write heads. The writing device 140 includes means for precisely positioning and aligning the write heads $200_i$ within the writing device 140. The write heads $200_i$ here are in each case designed to write to the semiconductor wafer $300_2$ via an individually controllable light beam $401_i$. For this purpose, each write head $200_1$, $200_2$, $200_3$ is connected to one or a plurality of light sources $111_i$, $112_i$, $113_i$ of the light generating device 110 via a plurality of optical waveguides $122_j$ of an optical waveguide group $121_i$ individually assigned to the respective write head $200_i$. In the present exemplary embodiment, each write head $200_i$ is assigned in each case three light sources $111_i$, $112_i$, $113_i$, wherein the light from the individual light sources is transferred to the respective write head $200_i$ in each case via a single optical waveguide $122_1$-$122_N$ of the associated optical waveguide group $121_i$. Alternatively, the light from a light source can also be fed to the respective write head $200_i$ via a plurality of optical waveguides. In order to obtain a high energy throughput, monomode optical waveguides are preferably used. It is provided that the intensity of the light fed to a write head $200_i$ via an optical waveguide group $121_i$ is individually modulatable for each optical waveguide $122_1$-$122_N$ of the optical waveguide group $121_i$. In the case where each optical waveguide $122_1$-$122_N$ of the optical waveguide group $121_i$ is assigned in each case one light source $111_i$, $112_i$, $113_i$, this can be carried out via an individual control of the respective light source $111_i$, $112_i$, $113_i$. By contrast, if a plurality of optical waveguides $122_1$-$122_N$ are assigned to a common light source $111_i$, $112_i$, $113_i$, the light intensity in the individual optical waveguides $122_1$-$122_N$ can be individually controlled via electro-optical modulators $131_i$ arranged in the transfer path between the respective light source $111_i$, $112_i$, $113_i$ and the assigned write head $200_i$. A corresponding modulation device 130 including a plurality of electro-optical modulators $131_1$, $131_2$, $131_3$ is shown by way of example in FIG. 1. For the coordinated driving of the modulation device 130, the latter is connected to the central control device 170 via a control line 172. The light generating device 110 is also connected to the central control device 170 via a dedicated control line 171 for the purpose of individual driving of individual light sources $111_i$, $112_i$, $113_i$ or light source groups including a plurality of said light sources $111_i$, $112_i$, $113_i$.

In order to generate a suitable writing beam $401_i$ for writing to the substrate wafer $300_2$, each write head $200_i$ includes an input coupling device 220 for coupling in the light from the associated optical waveguides $122_1$-$122_N$ of the optical waveguide group $121_i$ assigned to the respective write head $200_i$, a beam shaping device 230 for shaping a suitable light beam bundle 401 composed of the light beams $400_1$-$400_N$ from the individual optical waveguides $122_1$-$122_2$, a scanning device 240 for producing a scanning movement of the light beam bundle 401, and also an exit optical unit for projecting the generated light beam bundle 401 onto the surface of the substrate wafer $300_2$ to be written to. For controlling the scanning movement of each individual write head $200_i$, the writing device 140 is connected to the central control device 170 via at least one control line 173.

In order that the scanning movement of the light beam bundle $401_i$, which scanning movement is restricted only to a limited region of the substrate wafer $300_2$, is converted into a continuous writing movement, the substrate wafer $300_2$ to be written to is moved via the transport device 150 in a controlled movement below the writing device 140 in a predefined transport direction 501. In this case, the transport device 150 used can be any suitable device with the aid of which a precisely controllable transport movement of one or a plurality of substrate wafers 300 is possible. By way of example, the transport device 150 can be realized in the form of a conveyor belt for continuously transporting a plurality of substrate wafers $300_1$, $300_2$, $300_3$. For controlling the transport movement 50, the transport device 150 is connected to the central control device 170 via at least one control line 174.

For calibrating individual write heads 200 and monitoring the joint writing process of a plurality of write heads $200_i$, the lithography apparatus 100 furthermore includes a specific detection device 160 including preferably a plurality of detectors $161_i$. The detection device 160, which is connected to the central control device 170 via at least one control line 175, captures the position and, if appropriate, also the beam profile of the writing beams $401_i$ of the individual write heads $200_i$. Such a detection device can be realized in various ways, in principle. In the present exemplary embodiment, the detection device 160 arranged below the substrate wafer $300_2$ to be written to includes a plurality of measuring devices $161_i$ having in each case a plurality of specifically arranged photodiodes, said measuring devices being arranged in the writing beams $401_i$ of the individual write heads $200_i$.

Figure 2:
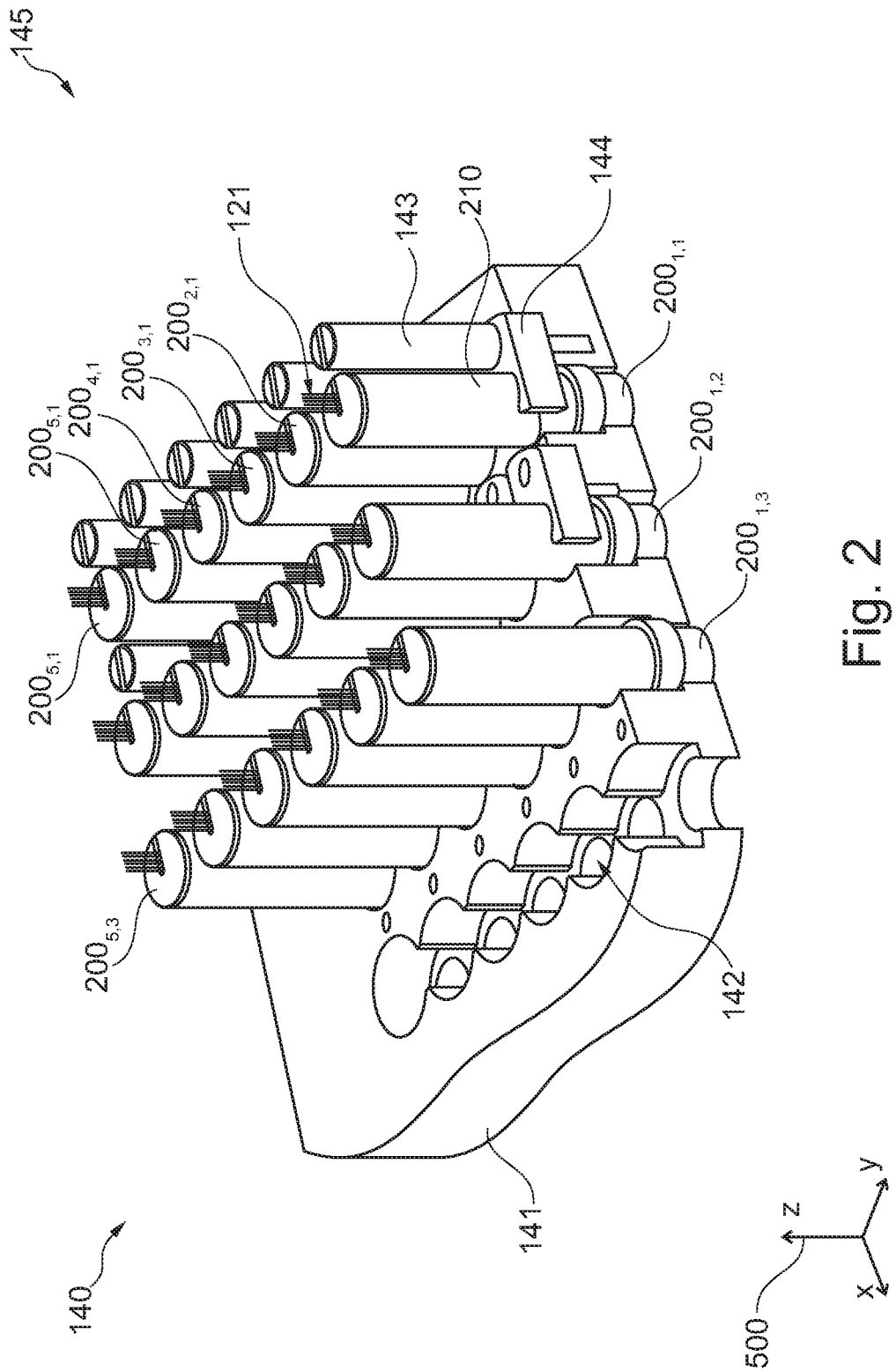
FIG. 2 shows by way of example a write head for a lithography apparatus with a multiplicity of write heads arranged in matrix form.

FIG. 2 shows by way of example a perspective sectional illustration through the writing device 140 of the lithography apparatus 100 according to the disclosure. The writing device 140 includes a baseplate 141 and a plurality of write heads $200_{i,j}$ arranged in matrix form and fixed within the baseplate 141. The write heads $200_{i,j}$ arranged in the form of rows and columns are in this case incorporated vertically in the z-direction in respective opening regions 142 specifically formed in the baseplate 141 and are individually alignable via specific holding elements 144 and associated adjusting screws 143. Within the write head arrangement 145 in matrix form, the individual write heads $200_{i,j}$ are arranged in the form of columns one behind another in the x-direction, which corresponds to the transport direction of the substrate 300, and alongside one another in the y-direction.

Figure 3:
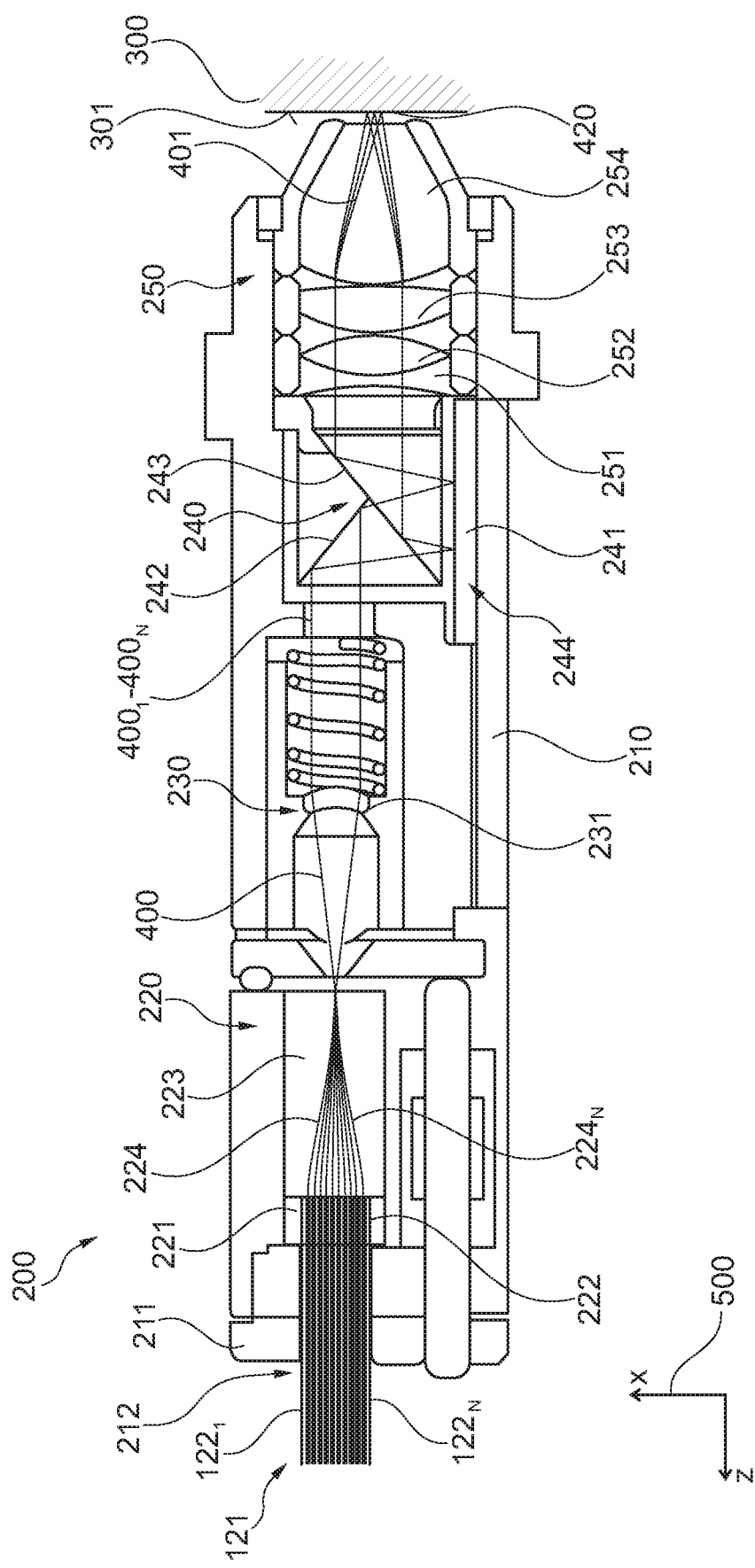
FIG. 3 shows by way of example the construction of a write head of the writing device from FIG. 2.

FIG. 3 shows the internal construction of a write head 200 according to the disclosure. The write head 200 has a pin-shaped housing 210, in which all the components of the write head 200 are integrated. The substantially cylindrical housing 210 has, shaped at the end, a housing cover 211 having an opening 212 for receiving optical waveguides $122_1$ to $122_N$ of an optical waveguide group $121_i$ assigned to the respective write head $200_i$. In this case, the opening 212 is preferably embodied in a slot-type fashion, such that the optical waveguides enter the write head 200 in a manner arranged alongside one another in the x-direction. In order to efficiently couple in the light from the optical waveguides $122_1$ to $122_N$, the write head 200 includes an input coupling device 220, which in the present case includes a suitable glass substrate 223 with waveguide structures $224_1$, $224_N$ which are formed therein and are respectively individually assigned to the optical waveguides $122_1$ to $122_N$. For fixing and precisely aligning the optical waveguides $122_1$ to $122_N$, the input coupling device 220 furthermore includes an optical waveguide receptacle 221, which can include for example a glass substrate having V-shaped grooves 222. The waveguide structures 224 combine the light beams from the individual optical waveguides $122_1$ to $122_N$ on the output side to form a narrow light beam bundle. The quality of the focus and the spacing of the beams on the substrate wafer result directly from the arrangement of the waveguides with respect to one another.

The light beams 400 emerging from the input coupling device 220 are subsequently shaped in a desired manner to form a parallel beam bundle in a beam shaping device 230, which includes a collimator lens 231 in the present exemplary embodiment. The collimator 231 ensures that the exit ends of the light waveguides, which are provided with a certain exit angle, are collimated. The parallel light beams $400_1$-$400_N$ now arranged offset at an angle with respect to one another subsequently pass into a scanning device 240 having at least one scanning mirror 241 for producing a periodic scanning movement of the writing beam 401 on the substrate wafer 300. In this case, the beams meet in a pupil plane, in which the scanning mirror 241 is situated in the case of a one-dimensional scanning device 240. In order to achieve a compact design of the write head 200, the scanning device 240 furthermore includes further deflection elements 242, 243 in the form of mirrors or prisms, with the aid of which the parallel light beams 400 are aligned again in the z-direction. A particularly compact design of the write head 200 is made possible as a result. Afterward, the parallel light beams $400_1$-$400_N$ fanned out at the scanning mirror 241 leave the write head 200 via a specific exit optical unit 250 (scanning objective lens), which focuses the individual light beams $400_1$-$400_N$ in the form of a converging writing beam bundle 401 onto the substrate wafer. In this case, parallel individual light spots $410_1$-$410_N$ (foci), arise, which represent a reduced imaging of the exit of the individual waveguides $122_1$-$122_N$. The parallel individual light spots $410_1$-$410_N$ are guided over the surface 301 of the substrate wafer 300 by the scanning movement.

The exit optical unit 250 preferably includes a plurality of optical elements 251, 252, 253, 254, which project the collimated light beams 400 deflected via the scanning device 240 into a corresponding number of individual light spots $410_i$-$410_N$, which are focussed on or in the region of the substrate surface 301 and converge to form a total light spot 420, on the surface 301 of the substrate wafer 300 or a light-sensitive layer arranged thereon (not shown here). In order to generate the most precise possible imaging of the individual light spots $410_i$-$410_N$ on the substrate surface 301, the optical elements 251, 252, 253, 254 can be embodied in the form of a telecentric scanning objective lens and/or in the form of an F-theta lens. From the superimposition of the light spots $410_i$-$410_N$ from the individual optical waveguides $122_1$ to $122_N$, a continuous light spot 420 extending preferably in the x-direction is formed in this way.

With the aid of the input coupling device 220 and the beam shaping device 230, the spatially separate arrangement of the outputs of the individual optical waveguides $122_1$-$122_N$ is converted into a corresponding number of collimated light beams $400_1$-$400_N$, separated from one another at an angle. In this case the pupil plane of these collimated light beams $400_i$-$400_N$ is formed by the minimum diameter of the overlapping light beams. In this case, the scanning element 241 is preferably arranged within the pupil plane and deflects the individual light beams according to their entrance angle. In the case where a plurality of scanning elements are used for a two-dimensional scanning movement, said scanning elements are preferably arranged as near as possible to the pupil plane (not shown here). In this case, the light beams 400 are deflected preferably in the y-direction, which runs perpendicularly to the plane of the drawing in FIG. 3. The scanning movement can be carried out sinusoidally (harmonically), in this case, wherein the scanning mirror 241 or the respective scanning element oscillates in a resonant fashion. Particularly high scanning amplitudes 433 are possible by this means. Furthermore, a rectangular driving of the scanning mirror 241 or of the scanning element or scanning elements is also possible.

Figure 4:
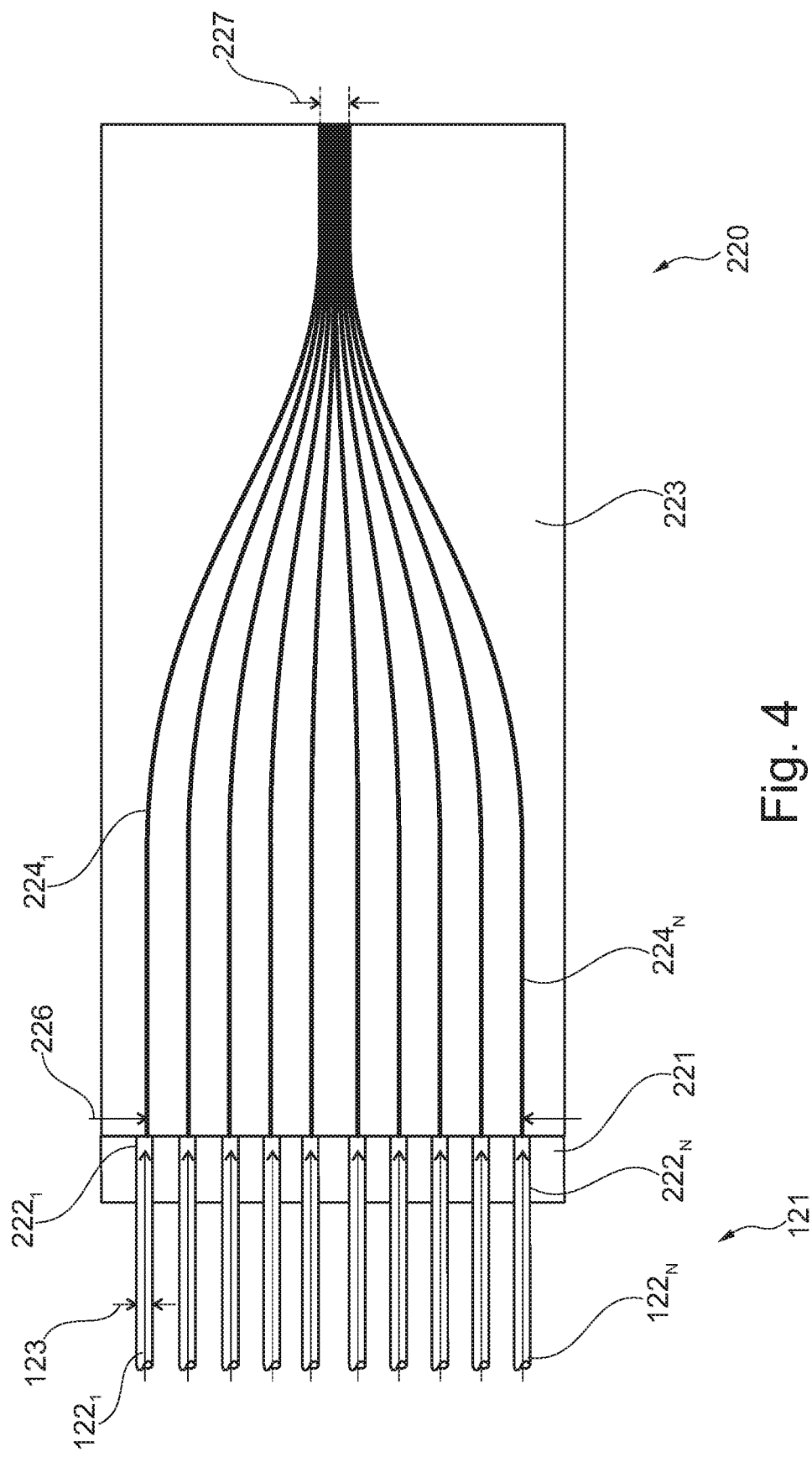
FIG. 4 shows by way of example an input coupling device for coupling a plurality of optical waveguides into a write head from FIG. 3.

In the present exemplary embodiment, the light from the individual optical waveguides $122_1$-$122_N$ is coupled in via a specific input coupling device 220, which is illustrated in greater detail in FIG. 4. In the present exemplary embodiment, the input coupling device 220 includes a flat waveguide substrate 223, in the surface of which a number of waveguides $224_1$-$224_N$ corresponding to the number of connected optical waveguides $122_1$-$122_N$ are formed. Such waveguides can be produced via ion diffusion, for example. For coupling the light from the optical waveguides $122_1$-$122_N$ into the waveguides, a receptacle plate 221 is provided, for example a glass plate, in which specifically shaped grooves $222_1$-$222_N$ for receiving the individual optical waveguides $122_1$-$122_N$ are formed. With the aid of the for example V-shaped grooves (V-grooves) the optical waveguides $122_1$-$122_N$ can be precisely aligned and fixed in relation to the waveguides $224_1$-$224_N$. The receptacle plate 221 can also be embodied integrally with the waveguide plate 223.

Figure 5:
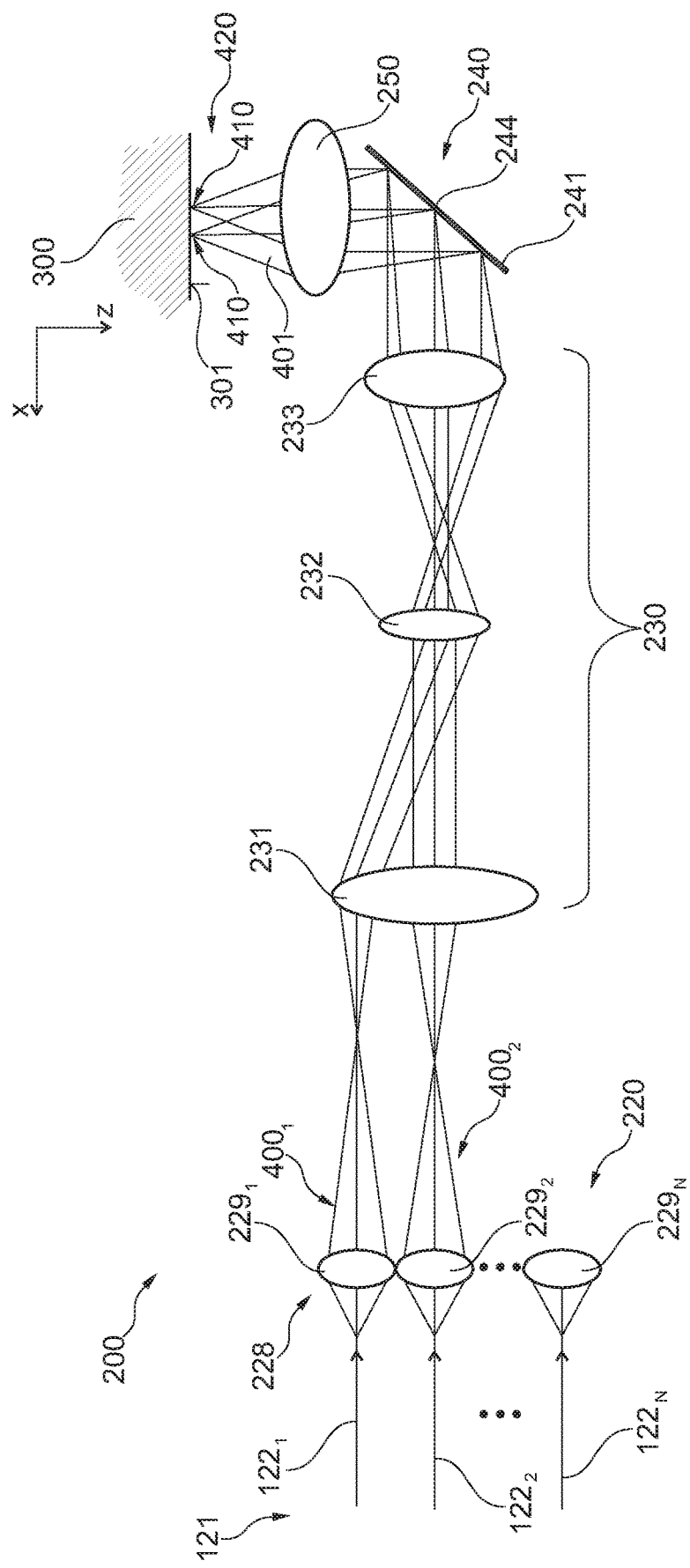
FIG. 5 shows an alternative embodiment of the write head with an input coupling device including a microlens arrangement.

The waveguides $224_1$-$224_N$ converge in a bell-shaped fashion on the waveguide plate 223, such that the light beams entering the waveguides over a width 226 on the input side are combined to a significantly smaller output width 227 in the waveguide substrate 223. As an alternative to the use of waveguides, a bundling of the light beams entering the write head via the optical waveguides $122_1$ to $122_n$ can also be realized with the aid of a microlens arrangement. FIG. 5 schematically shows an alternative embodiment of the write head 200 including a corresponding microlens arrangement 228. The microlens arrangement 228 includes a number of microlenses $229_1$-$229_N$ corresponding to the number of entering optical waveguides $122_1$-$122_N$, via which microlenses the outputs of the corresponding optical waveguides $122_1$-$122_N$ are firstly magnified, for example by a factor of 20×. Afterward, the magnified image is reduced to the desired size, for example by the factor 1/20×, via a telescope 230 including the optical elements 231, 232, 233, for example. The correspondingly shaped light beams $400_1$-$400_N$ can subsequently be deflected in a desired manner in a scanning device 240 including a scanning mirror 241 or other scanning elements. The deflected light beams 401 are then projected via an exit optical unit 250, which is illustrated merely in the form of an exit lens in FIG. 5, in a suitable manner onto the surface 301 of the substrate 300 or a light-sensitive layer (not shown here) arranged on the substrate 300, in the form of a light spot 420 composed of a plurality of individual light spots $410_1$-$410_N$.

Figure 6:
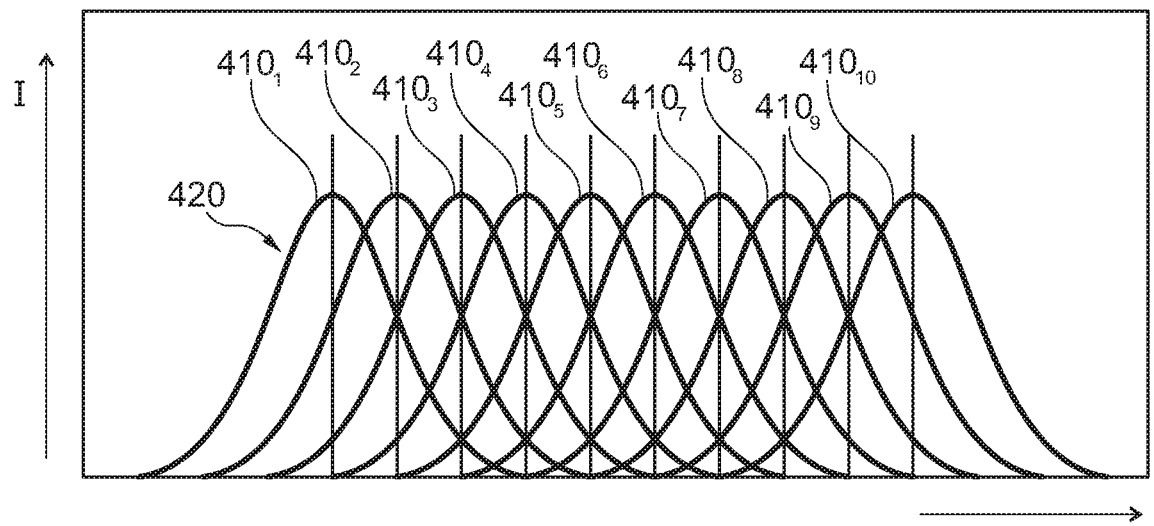
FIG. 6 shows by way of example the distribution of the light intensity of a light spot formed from a plurality of light beams.

FIG. 6 shows by way of example the intensity distribution of a light spot 420 composed of a total of ten individual light spots $410_1$-$410_{10}$. The intensity distribution of the individual light spots $410_1$-$410_{10}$ is illustrated in each case in the form of a Gaussian curve with an intensity maximum identified via a vertical line. The individual light spots $410_1$-$410_{10}$, preferably arranged at identical distances alongside one another in the x-direction, are superimposed in this case to such an extent that a continuous light spot 420 that is elongate in the x-direction and has a desired width results therefrom. By individual modulation of the light beams $400_1$-$400_N$ coupled into the respective write head 201 by the individual optical waveguides $122_1$-$122_N$, the intensity profile of the composite light spot 420 can be varied arbitrarily. In particular, the width of the composite light spot 420 can be altered by a reduction of the light intensity of the marginal rays. Besides the width variation, by introducing individual light beams on one side and simultaneously masking out individual light beams on the opposite side, it is also possible to realize a lateral displacement of the total light spot 420 generated by superimposition of the individual light spots $410_1$-$410_N$. These possibilities for variation of the width and the lateral position of the light spot 420 can be used for better control of the writing process on the substrate. In particular, an improvement of the resolution obtained can be realized via the variation of the width of the light spot. Furthermore, distortions which can arise in the image field during operation can also be compensated for by variation of the line width.

Figure 7:
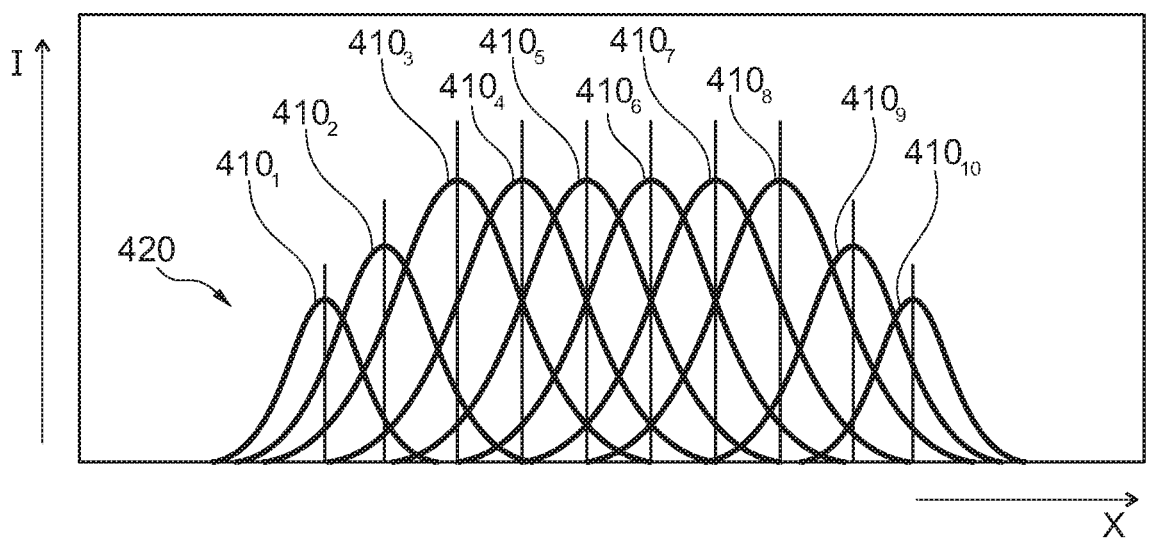
FIG. 7 shows the distribution of the light intensity in the case of a light spot whose width is reduced by modulation of the outer light beams.

FIG. 7 shows by way of example a composite light spot 420 having a total width reduced by the reduction of the light intensity of the outer beams $410_1$, $410_2$, $410_9$, $410_{10}$.

As already described in connection with FIG. 1, the writing process of a write head 200 is carried out via a superimposition of the transport movement of the substrate wafer 300 in the x-direction and a scanning movement 502 of the light spot 420 projected onto the substrate surface 301, said scanning movement being carried out transversely with respect to the transport movement. FIG. 8 elucidates the process of writing to a defined strip 430 of the substrate surface 301 via the superimposition of the periodic scanning movement 502 and the transport movement 501. The illustration shows a plan view of a region of the substrate surface 301 situated below a write head 200. In this case, the substrate wafer 300 performs the transport movement 501 continuously in the x-direction. In this case, the light spot 420 projected onto the substrate surface 301 simultaneously performs a preferably resonant oscillation movement 502 in a predefined scanning direction 506. In the case of a one-dimensional scanning movement 502, the scanning region 251 that can be captured directly by the light spot 420 is predefined in particular by the width of the light spot 420 and the scanning amplitude 433 in the x-direction. The superimposition of the transport movement 501 and the oscillation movement 502 results in a substantially harmonic or sinusoidal movement trajectory 504 of the light spot 420 on the substrate wafer 300. In this case, the speeds of the transport movement 501 and of the oscillation movement 502 are coordinated with one another in such a way that the light spot 420 passes at least once every region of the exposed strip 430 of the substrate surface 301, said exposed strip being delimited via the dotted lines. Since a substantially sinusoidal exposure pattern is generated in this case, regions exposed to different extents are generally present. If the transport speed 501 of the substrate 300 is too high, adjacent loops of the sinusoidal exposure pattern can be so far apart from one another that specific substrate regions between the loops remain unexposed. In order to prevent this and thus to enable higher transport speeds of the substrate and hence also higher writing speeds, an alternative scanning device having a two-dimensional scanning movement can be used. In the case of this scanning device, besides the periodic oscillation movement carried out transversely with respect to the transport movement 501, an additional line compensation movement 503 in the x-direction is also carried out. In this respect, FIG. 9 shows by way of example an exposure trajectory 505 realized via such a 2D scanning device. While the exposure spot 420, on account of the oscillation movement of the scanning mirror 241, still carries out a preferably harmonic oscillation movement 502 in the scanning direction 506, a periodic line compensation movement 503—carried out in a line compensation direction 507 transversely with respect to the scanning direction 506—for compensation of the transport movement 501 of the substrate 300 can be realized with the aid of the same scanning mirror 241 or with the aid of a further scanning element of the write head $200_{i,j}$.

Since the amplitude of the compensation movement 503 typically turns out to be significantly smaller than the amplitude 433 of the scanning movement 502, a non-harmonically oscillating scanning element can also be used in this case. Given optimum coordination of the two periodic movements 502, 503 with one another, it is thus possible even to realize a substantially rectangular movement trajectory 505 of the light spot 420 on the substrate 300. As a result of the significantly more uniform exposure of the strip 430 in this case, higher transport speeds and thus higher writing speeds can also be realized by this means in comparison with a scanning device that operates only one-dimensionally.

Both in the case of one-dimensional scanning and in the case of two-dimensional scanning, however, the scanning direction 506 need not necessarily correspond to the y-direction predefined by the lithography apparatus 100, which is the case as in the examples in FIGS. 8 and 9. Rather, the scanning movement 502 can also be carried out in a direction that deviates from the y-direction. The same also applies to the line compensation direction 507, which corresponds to the x-direction in the present example.

As is shown in detail in FIGS. 8 and 9, each write head $200_{i,j}$ of the writing device 140 in each case writes to a dedicated substrate strip $430_{i,j}$ having a strip width 431 determined by the scanning amplitude 433 of the respective write head $200_{i,j}$. For transferring the desired structures into the substrate or in a light-sensitive layer arranged on the substrate, the scanning light spot 420 is switched on and off by modulation of the light sources or of the individual optical waveguides of the respective write head. This can be carried out repeatedly during an up or down movement of the light spot 420 corresponding to half a scanning period 432, depending on the desired resolution. In this regard, structure widths corresponding to the extent of the light spot 420 in the y-direction can be realized, in principle, in the y-direction. On the other hand, by switching on and off the marginal regions or else the central regions of the light spot 420, it is possible to obtain in the x-direction, too, structure widths corresponding, in principle, to the dimensions of an individual light spot $410_1$-$410_N$ of which the spot 420 is composed.

The use of a plurality of write heads $200_{i,j}$ having writing or scanning regions 251 respectively offset relative to one another in the transport direction 501 allows parallel writing to larger continuous substrate areas 450. In this respect, FIG. 10 shows a first exemplary embodiment including a matrix-type arrangement of a total of 15 write heads $200_{i,j}$. In this case, the write heads $200_{i,j}$ are combined in three columns each having five write heads $200_{i,1}$-$200_{i,5}$. In this case, the individual scanning regions 251 of the write heads $200_{i,1}$-$200_{i,5}$ are arranged in a manner offset with respect to one another in each case by a maximum of a strip width 431 in the y-direction for example via an individual setting of the scanning mirrors 241 of the respective write heads 200$_{i,1}$-200$_{i,5}$. This results in strips 430$_{i,1}$-430$_{i,5}$ which touch one another or slightly overlap and which together produce a seamlessly closed area 440$_i$. Via a corresponding arrangement of the write heads 200$_{i,j}$, the strip-shaped areas 440$_i$ formed from the write heads 200$_{i,1}$-200$_{i,5}$ arranged one behind another in each case in the x-direction can be combined seamlessly to form a strip-shaped total area 450.

As an alternative to the offset arrangement of the scanning regions of individual write heads, the write heads 200$_{i,1}$-200$_{i,5}$ arranged one behind another in the x-direction can also be arranged in a manner offset relative to one another in each case by a strip width 431 in the y-direction, in order to obtain a closed wider strip 440$_i$. A corresponding embodiment is shown by way of example in FIG. 11.

As a result of the total area 450 written to being composed of individual strip regions written to parallel to one another (referred to as stitching), lithography apparatus for writing to substrate wafers of arbitrary size can be realized in principle. In order to be able to precisely control the distance between the individual strips or their overlap region, the width and position of the individual strip-shaped regions written are coordinated with one another. This is particularly important since the components of the lithography apparatus 100 during operation are subject to various disturbing influences which can influence the writing process of individual write heads differently. In this regard, the scanning regions of adjacent write heads can drift apart for example on account of temperature differences of the corresponding components. Therefore, by way of example, the detection device 160 already described in connection with FIG. 1 is used for calibrating and monitoring the operation of the writing device 140. Such a detection device 160 can consist for example of one or a plurality of measuring devices 161$_{i,j}$ each having a pair of photodiodes, said measuring devices being installed below the substrate wafer in a positionally fixed manner relative to the respective write head 200$_{i,j}$. FIG. 12 shows by way of example a measuring device 161$_{i,j}$ of such a detection device 160 having two photodiodes 162 and 163 arranged at a predefined distance from one another. The two photodiodes 162, 163 are fixed on a carrier substrate 164, which preferably consists of a material having the smallest possible temperature drift, such as "Zerodur", for example. The measuring device 161$_{i,j}$ can be installed for example in a positionally fixed manner relative to the respectively associated write head 200$_{i,j}$ below the receptacle device 151 of a processed substrate wafer 300. The measuring device 161$_{i,j}$, initially concealed by the substrate wafer 300 during the writing process, is freed by the further transport of the respective substrate wafer 300 after the end of the writing process. For this purpose, a specific window region 152 between adjacent substrate wafers 300$_1$, 300$_2$ can be provided in the transport direction 150. Each of the two photodiodes 162 and 163 detects in each case the point in time of the passage of the oscillating light spot 420. On the basis of the temporal deviation of the detector signals from a reference signal, the amplitude 433 and/or lateral position of the scanning region 251 of the respective write head 200$_{i,j}$ can be deduced. For detecting each individual light spot 410$_1$-410$_N$ of the composite light spot 420, the measuring device 161$_{i,j}$ can have a corresponding number of pairs of photodiodes arranged closely alongside one another (not shown here). Such a measuring device 161$_{i,j}$ also enables monitoring or calibration of the light spot profile of the respective light spot 420, such as e.g. its width and y-position.

Since the detection is carried out in each case for the individual write head, each of the write heads 200$_{i,j}$ used is individually assigned in each case at least one measuring device 161$_{i,j}$. FIG. 13 shows a possible arrangement of a plurality of measuring devices 161$_{i,j}$ of the detector device 160 below a writing device including a total of nine write heads 200$_{i,j}$. The individual measuring devices 161$_{i,j}$ here are arranged in each case exactly below the associated write heads 200$_{i,j}$, the position of which is indicated here via a dashed line. A window region 152 produced between two substrate wafers 300$_1$, 300$_2$ or specifically embodied in the form of an opening in the transport device 150 frees the respective measuring devices 161 after the passage of the substrate wafer 300$_2$ that has undergone writing to a finish.

FIG. 14 shows an alternative possibility for realizing a corresponding detection device 160. A test substrate 310 having reflective test structures 311, 312 is used in this case. The test structures 311, 312 are arranged here in each case such that when the test substrate 310 passes below the respective write head 200, the incident light beams are reflected back from the test structures 311, 312 into the write head 200. The light 402 reflected back preferably passes via the same optical path to the scanning mirror 241 and is subsequently deflected by a beam splitter 265 to a detecting photodiode 166 or an arrangement including a plurality of photodiodes (not shown here) respectively assigned to the individual light beams. Each detector signal is subsequently compared with a corresponding reference signal. On the basis of the comparison result, statements can then be made about the scanning amplitude 433, scanning position and, if appropriate, also about the light spot profile.

FIG. 15 shows a corresponding test substrate 310 between two regular substrate wafers 300$_1$, 300$_2$. In this case, one or a plurality of pairs of such test structures 311, 312 are arranged on the test substrate 310 for each write head 200$_{i,j}$. In this case, the number and arrangement of the test structures on the test substrate can be adapted to the respective desired properties. As an alternative or in addition thereto, it is also possible for corresponding test structures also to be arranged on the regular substrate wafers 300$_1$, 300$_2$ (not shown here). Such test structures can preferably be arranged in regions which are not written to anyway or are specifically provided for calibration.

In order, on the basis of the detector signal of the photodiodes 161, 162, 166 to be able to make a statement about the amplitude 433 of the scanning movement 502 of the light spot on the substrate wafer and the lateral position of the strip-shaped region respectively written to, the temporal sequence of the respective signals is analysed. In this respect, FIG. 16 shows by way of example the relationship between the temporal change in a detector signal and the corresponding variations of the scanning movements. In this case, the upper part of the diagram illustrates the temporal change in the y-position of the light spot 410, 420 carrying out an oscillating movement in various operating situations. In this case, the curve 510 depicted by a solid line represents the movement of the light spot 420 oscillating with the desired amplitude 433 and in the desired position. The upper horizontal line 513 represents for example the y-position of the first photodiode 162 of the detector device assigned to the respective write head 200, while the lower horizontal line 514 represents the y-position of the second photodiode 163. In the case of the alternative detection device, the horizontal lines 513, 514 in each case represent the y-positions of the two test structures 131, 132 of the respective write head 200. The points of intersection of the individual curves 510, 511, 512 with the two horizontal lines 513, 514 correspond in each case to the passing of the scanning light spot 410, 420 over one of the photodiodes 162, 163 or test structures 131, 132. These events define the points in time of the associated excursions of the respective detector signal. The lower region of the diagram illustrates the profiles of the three detector signals 515, 516, 517, that are respectively assigned to one of the three curves 510, 511, 512. In this case, the second curve 515 shows the profile of the detector signal for the "regular" scanning process represented via the solid line. In this case, the detector signal exhibits a specific regular pattern that can be used as a reference signal for the other operating situations. In this regard, an increase in the scanning amplitude 433, as is the case for the curve 511 shown via the dashed line, has the effect that the signal excursions of the two photodiodes 162, 163 are shifted symmetrically with respect to one another. This is evident in the second detector signal profile 516 by a comparison with the reference signal.

By contrast, if the position of the exposed strip drifts along the y-direction, as is the case for example for the curve 512 shown via the dash-dotted line, then the corresponding detector signal 517 exhibits an asymmetrical shift in the signal excursions of the two photodiodes 162, 163.

As already described in connection with FIGS. 8 and 9, the scanning movement of the light spot for writing to the respective substrate strip can be carried out both one-dimensionally and two-dimensionally. In the case of the two-dimensional scanning movement, it is desirable for the line compensation movement carried out in the transport direction of the substrate to be precisely coordinated with the scanning movement carried out transversely with respect to the transport direction of the substrate. This is achieved in particular via two micromechanical mirrors that are controllable independently of one another. In contrast thereto, in the case of the one-dimensional scanning movement, only one scanning mirror is used, as a result of which the outlay on apparatus is significantly reduced in comparison with the two-dimensional scanning movement.

However, a harmonically oscillating scanning mirror without a corresponding line compensation movement produces a sinusoidal trajectory of the light spot on the substrate moving underneath. On account of the sinusoidal form, the trajectory in the regions of the upper and lower turning points deviates very greatly from a straight line. Furthermore, at the turning points the speed of the light spot decreases in comparison with the central scanning region. Consequently, the residence duration of the light spot increases in the region of a turning point. In the case of an illumination intensity kept constant over the entire period, an increased residence duration and the curved trajectory would lead to significantly more highly exposed outer regions of the strip written to by the respective write head. This can be prevented in various ways. By way of example, the oscillation amplitude of the scanning mirror can be chosen to have a magnitude such that the upper and lower turning regions of the sinusoidal trajectory of the light spot lie distinctly outside the strip to be written to. Via suitable shading or via switching off the light source in the upper turning regions, it can be ensured that the illumination takes place only within the strip-shaped substrate region. Such an arrangement is illustrated schematically by way of example in FIG. 17. As is evident here, the upper and lower turning points of the sinusoidal trajectory 504 lie outside the strip 430 to be exposed. The central regions of the movement trajectory 504, which are arranged within the strip 430, run approximately linearly here. One disadvantage of this concept is that on account of the overshoot of the movement trajectory outside the strip 430 to be exposed, the write head has relatively long dark phases in which no exposure of the substrate within the strip 430 takes place. This results in a lower throughput overall. An increase in the throughput can be achieved by a reduction of the dark phases of the movement trajectory 504. For the same light intensity, the same substrate speed and the same scanning frequency, a reduction of the scanning amplitude leads to a longer residence duration of the light spot above the regions of the substrate that are to be written to. The lower writing speed resulting therefrom leads to an increase in the light dose per unit area. A corresponding schematic illustration of a scanning movement with reduced dark phases is illustrated in FIG. 18.

On account of the geometry of the sinusoidal trajectory 504 and the reduced speed of the light spot 420 in the regions of the turning points 508, 509, the residence duration of the light spot 420 on the substrate surface 301 is significantly higher in the marginal regions 434, 436 of the strip 430 than in the central region 435. Given constant light power of the write head, the marginal regions 434, 436 of the strip 430 would therefore be exposed to a significantly greater extent than its central region 435. In order to obtain a homogeneous exposure of the entire strip 430, it is thus expedient to vary the light intensity of the light spot 420 or of the light beams $410_1$-$410_{10}$ forming the light spot 420 in a manner dependent on the position thereof along the scanning direction y. By way of example, in the case of a pulsed light source, both the switch-on and the switch-off phases of the light source can be varied jointly or independently of one another. Furthermore, the intensity of the light spot 420 can be varied by modulation of the light source or of a light-guiding element disposed downstream of the light source, such that the intensity of the light spot turns out to be lower in the outer regions 434, 436 of the strip 430 than in the central region 435 thereof. In order to obtain a homogeneous illumination, in this case, both the duty ratio and the light intensity of the individual light spots 410 forming the light spot 420 can be varied both jointly and independently of one another. In this regard, by way of example, individual light spots 410 of the total light spot 420 can be switched off separately in order to reduce the light intensity. As an alternative thereto, the light intensity of individual light spots 410 of the total light spot 420 can be modulated in a suitable manner.

Via a suitable intensity variation of individual light spots 410 or of the entire light spot 420, a homogeneous illumination over a plurality of scanning periods can thus be achieved even in the case of a sinusoidal movement trajectory 504.

In order to achieve a homogeneous exposure of the substrate surface, the intensity of the light beams 400 that generate the individual light spots 410 is varied in a predefined manner. This results in a specific exposure pattern in which the arrangement of the individual light spots on the substrate turns out to be relatively complex on account of the sinusoidal movement trajectory. In order to be able to write structures on the substrate surfaces, the contours of the respective structures have to be transferred to the exposure pattern. On account of the abovementioned complexity of the exposure pattern, the transfer of the structures to be written is relatively computationally complex.

In order to simplify this method step, the complex exposure pattern can be decomposed into two separate partial exposure patterns. For this purpose, all light spots which lie on the falling edges of the sinusoidal movement trajectories of the respective light spots are combined to form a first partial exposure pattern 520. In a manner corresponding thereto, all light spots which lie on the rising edges of the sinusoidal movement trajectories of the respective light spots are combined to form a second partial exposure pattern 530. The desired structures are subsequently transferred separately into each of the two partial exposure patterns 520, 530. Since the desired structures are impressed congruently in each of the partial exposure patterns 520, 530 the structures to be written are optimally reproduced in the total exposure pattern arising as a result of the superimposition of the two partial exposure patterns 520, 530 during the writing process. FIG. 19 schematically illustrates the first partial exposure pattern 520, which contains all the switch-on phases of the individual light spots $410_1$ to $410_{10}$ of a total light spot 420 during the movement from an upper turning point 508 to a lower turning point 509. In this case, the corresponding portions of the movement trajectories $521_1$-$521_{10}$ of the light spots $410_1$-$410_{10}$ are represented via dotted lines. In this case, the individual light spots $410_1$ to $410_{10}$ are each represented via dashed lines, wherein the respective midpoints of the light spots are represented via small circles 411. For the sake of clarity, only the topmost and bottommost light spots $410_1$ to $410_{10}$ are represented via the dashed circles. Furthermore, only the light spots and the associated trajectories during an individual scanning movement from the upper turning point 508 to the lower turning point 509 have been illustrated, for reasons of clarity. As indicated via dots in the drawing, the first partial exposure pattern 520 is typically composed of a sequence of such portions like the portion illustrated in FIG. 19. In this case, the individual portions can be superimposed to a greater or lesser extent depending on the application.

Analogously to FIG. 19, FIG. 20 illustrates the second partial exposure pattern 530, which corresponds to the distribution of the exposure spots on the substrate surface which are generated during in each case half a scanning period in the course of the movement of the light spot from the lower turning point 509 to the upper turning point 508.

Although the disclosure has been more specifically illustrated and described in detail via the preferred exemplary embodiment, nevertheless the disclosure is not restricted by the examples disclosed, and other variations can be derived therefrom by the person skilled in the art, without departing from the scope of protection of the disclosure.

LIST OF REFERENCE SIGNS

100 Lithography apparatus
110 Light generating device
111-119 Light sources
120 Light transferring device
121 Optical waveguide group
122 Optical waveguide
123 Diameter of an optical waveguide
130 Modulation device
131 Electro-optical modulator
140 Writing device
141 Baseplate
142 Opening in the baseplate
143 Adjusting screw
144 Holding element
145 Write head arrangement in matrix form
150 Transport device
151 Receptacle device
152 Window region between two receptacle devices
160 Detection device
161 Measuring device
162,163 Photodiodes
164 Carrier substrate
165 Semitransmissive mirror
166 Internal photodiode
170 Control device
171 First control line
172 Second control line
173 Third control line
174 Fourth control line
175 Fifth control line
200 Write head
210 Housing
211 Housing cover
212 Slot-shaped housing opening
220 Input coupling device
221 Receptacle plate
222 Centring device/V-grooves
223 Waveguide substrate
224 Waveguide
225 Waveguide exit facets
226 Input width
227 Output width
228 Microlens arrangement
229 Microlens
230 Optical device/beam shaping device
231-233 Lenses of the beam shaping device
240 Scanning device
241 Scanning mirror
242,243 Deflection elements
244 Scanning axis
250 Exit optical unit
251 Scanning region
251-254 Lenses of the exit optical unit
300 Substrate wafer
301 Substrate surface
310 Test substrate wafer
311,312 Reflective test structures
400 Light beams
401 Writing beam bundle
402 Reflected light beams
410 Individual light spot of a light beam
411 Centre of an individual light spot
420 Light spot composed of individual light spots
430 Strip exposed by the light spot
431 Width of the strip
432 Scanning period
433 Amplitude of the scanning movement
434 Upper marginal region of the exposed strip
435 Central region of the exposed strip
436 Lower marginal region of the exposed strip
440 Group of strips written to
450 Exposed total area
500 Coordinate system
501 Transport movement
502 Periodic scanning movement
503 Periodic line compensation movement
504 First movement trajectory
505 Second movement trajectory
506 Scanning direction
507 Direction of the line compensation movement
508 Upper turning point
509 Lower turning point
510 First trajectory
511 Second trajectory
512 Third trajectory
513 Position of the first photodiode/test structure
514 Position of the second photodiode/test structure 515 First signal curve
516 Second signal curve
517 Third signal curve
520 First partial exposure pattern
521 Falling edge of the movement trajectory
530 Second partial exposure pattern
531 Rising edge of the movement trajectory
x x-direction/transport direction
y y-direction/scanning direction
z z-direction (vertical direction)
I Light intensity
A Amplitude of the detection signal

What is claimed is:

1. An apparatus, comprising:
a light generating device comprising at least one light source configured to generate light;
a writing device comprising a plurality of individually controllable write heads configured to project the light from the at least one light source onto different regions of a substrate wafer;
a light transferring device comprising a plurality of optical waveguides configured to transfer the light from the light generating device to the writing device;
a transport device configured to provide relative movement between the writing device and the substrate wafer in a transport direction; and
a control device configured to control writing on the substrate wafer,
wherein:
each write head comprises:
a light input coupling device configured to couple the light from the plurality of optical waveguides into the write head;
an optical device configured to generate a light spot comprised of the beams from the individual optical waveguides on the substrate wafer; and
a scanning device configured to move the light spot in a scanning manner on the substrate wafer in a scanning direction which is transverse to the transport direction,
each light input coupling device comprises a plurality of microlenses and a telescope optical unit optically downstream of the microlenses;
each microlens is configured to produce a magnified image of an output of an optical waveguide assigned to the microlens; and
each telescope optical unit is configured to reduce a size of the magnified image so that the light spot comprised of the light beams of the individual optical waveguides arises on the substrate wafer;
for each write head, the scanning device is downstream of the telescope optical unit; and
the apparatus is a lithography apparatus.

2. The apparatus of claim 1, wherein:
for at least one of the write heads, the scanning device comprises an oscillating scanning mirror configured to generate a sinusoidal movement trajectory of the light spot on the substrate wafer moving in the transport direction; and
the control device is configured to vary a light intensity of at least one of the light beams forming the light spot on the substrate wafer depending on a current speed of the light spot on the substrate wafer during a scanning period.

3. The apparatus of claim 1, wherein:
each write head is configured to expose a strip-shaped region of the substrate wafer; and
the strip-shaped regions exposed by different write heads are offset relative to each other in the transport direction so that the strip-shaped regions form a continuous area.

4. The apparatus of claim 3, further comprising a detection device comprising a plurality of measuring devices, wherein each measuring device:
is individually assigned to the individual write heads to monitor a width and/or an orientation of the strip-shaped regions; and
comprises at least two photodiodes arranged one behind the other in a scanning direction of the light beam in a scanning region of the respective write head, the scanning direction being transverse to the transport direction.

5. The apparatus of claim 4, wherein each measuring device is configured to individually detect each light beam of the light spot comprised of the light beams from the individual optical waveguides.

6. The apparatus of claim 1, further comprising:
a detection device comprising a plurality of measuring devices; and
a light detector,
wherein:
each measuring device is assigned to the individual write heads to monitor a width and an orientation of strip-shaped regions;
each measuring device comprises two reflective structures on the substrate wafer along a scanning direction which is transverse to the transport direction;
each reflective structure is configured to enable capture by the light spot of the respective write head; and
the light detector is in the respective write head and configured to detect light reflected back from the reflective structures.

7. The apparatus of claim 6, wherein the measuring device is configured to individually detect each light beam of the light spot comprised of the light beams from the individual optical waveguides.

8. The apparatus of claim 1, wherein an individual light source is assigned to a single write head, and each light source is individually drivable.

9. The apparatus of claim 1, wherein:
a light source is assigned to a plurality of the write heads; and
each write head is assigned an individual electro-optical modulator configured to modulate a light intensity of the light provided by the light source assigned to the write head.

10. The apparatus of claim 1, wherein each optical waveguide assigned to a write head is respectively assigned a separately drivable electro-optical modulator.

11. The apparatus of claim 1, wherein for each microlens:
there is only one optical waveguide assigned to the microlens; and
the microlens is configured to image, in a magnified fashion, only the output of the one optical waveguide assigned to the microlens.

12. A method, comprising:
providing the apparatus of claim 1;
moving the substrate wafer in the transport direction;
projecting a plurality of light beams onto the substrate wafer to generate on the substrate wafer a light spot formed from a plurality of individual light spots;
oscillating the light spot transverse to the transport direction to generate a sinusoidal movement trajectory of the light spot on the substrate wafer; and varying a light intensity of at least one of the light beams during a scanning period depending on a current speed of the light spot on the substrate wafer.

13. A write head, comprising:
a light input coupling device;
an optical device; and
a scanning device,
wherein:
the write head is configured to be used with an apparatus, comprising:
a light generating device comprising at least one light source configured to generate light;
a writing device comprising a plurality of individually controllable write heads configured to project the light from the at least one light source onto different regions of a substrate wafer;
a light transferring device comprising a plurality of optical waveguides configured to transfer the light from the light generating device to the writing device;
a transport device configured to provide relative movement between the writing device and the substrate wafer in a transport direction; and
a control device configured to control writing on the substrate wafer;
the light input coupling device comprises a plurality of microlenses and a telescope optical unit optically downstream of the microlenses;
each microlens is configured to produce a magnified image of an output of an optical waveguide assigned to the microlens;
the telescope optical unit is configured to reduce the size of the image so that the light spot comprised of the light beams of the individual optical waveguides arises on the substrate wafer;
the scanning device is downstream of the telescope optical unit; and
the write head is configured to be used with the apparatus such that
each light input coupling device couples the light from a plurality of optical waveguides; and
each optical device generates a light spot comprised of the light beams from the individual optical waveguides on the substrate wafer;
the scanning device moves the light spot in a scanning manner on the substrate wafer in a scanning direction which is transverse to the transport direction.

14. The write head of claim 13, wherein:
the scanning device comprises a scanning mirror that is movable about a scanning axis and that is configured to guide the light spot imaged on the substrate wafer in a periodic scanning movement over the substrate wafer; and
the periodic scanning movement is transverse to the transport direction.

15. The write head of claim 14, wherein the scanning device is configured to perform a periodic line compensation movement of the light spot on the substrate wafer.

16. The write head of claim 13, wherein:
the optical device comprises a collimator optically upstream of the scanning device to generate parallel light beams; and
a telecentric imaging optical unit and/or an f-theta lens optically downstream of the scanning device to focus the parallel light beams on the substrate wafer.

17. The write head of claim 13, wherein:
the scanning device comprises an oscillating scanning mirror configured to generate a sinusoidal movement trajectory of the light spot on the substrate wafer moving in the transport direction; and
the control device is configured to vary a light intensity of at least one of the light beams forming the light spot on the substrate wafer depending on a current speed of the light spot on the substrate wafer during a scanning period.

18. The write head of claim 13, wherein:
the write head is configured to expose a strip-shaped region of the substrate wafer; and
the strip-shaped regions exposed by different write heads of the apparatus are offset relative to each other in the transport direction so that the strip-shaped regions form a continuous area.

19. The write head of claim 18, further comprising:
a detection device comprising a plurality of measuring devices; and
a light detector,
wherein:
each measuring device is assigned to an individual write head to monitor a width and an orientation of the strip-shaped regions;
each measuring device comprises two reflective structures on the substrate wafer along the scanning direction;
each reflective structure is configured to capture by the light spot of the respective write head; and
the light detector is in the respective write head and configured to detect light reflected back from the reflective structures.

20. The write head of claim 19, wherein the detection device is configured to individually detect each light beam of the light spot comprised of the light beams from the individual optical waveguides.

21. The write head of claim 13, wherein a light source is assigned to a single write head, and each light source is individually drivable.

22. The write head of claim 13, wherein for each microlens:
there is only one optical waveguide assigned to the microlens; and
the microlens is configured to image, in a magnified fashion, only the output of the one optical waveguide assigned to the microlens.

* * * * *

UNITED STATES PATENT AND TRADEMARK OFFICE
CERTIFICATE OF CORRECTION

PATENT NO.        : 11,003,090 B2
APPLICATION NO.   : 16/778359
DATED             : May 11, 2021
INVENTOR(S)       : Stefan Richter et al.

It is certified that error appears in the above-identified patent and that said Letters Patent is hereby corrected as shown below:

In the Claims

Column 21, Line 40, Claim 13, after "that" insert -- : --.

Signed and Sealed this
Sixth Day of July, 2021

Drew Hirshfeld
*Performing the Functions and Duties of the*
*Under Secretary of Commerce for Intellectual Property and*
*Director of the United States Patent and Trademark Office*